US012765089B2

(12) United States Patent
Otake et al.

(10) Patent No.: US 12,765,089 B2
(45) Date of Patent: Oct. 13, 2026

(54) LIGHT DETECTION DEVICE AND DISTANCE MEASUREMENT APPARATUS

(71) Applicant: Sony Semiconductor Solutions Corporation, Kanagawa (JP)

(72) Inventors: Yusuke Otake, Kanagawa (JP); Toshifumi Wakano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 720 days.

(21) Appl. No.: 18/258,063

(22) PCT Filed: Jan. 13, 2022

(86) PCT No.: PCT/JP2022/000991
§ 371 (c)(1),
(2) Date: Jun. 16, 2023

(87) PCT Pub. No.: WO2022/163373
PCT Pub. Date: Aug. 4, 2022

(65) Prior Publication Data
US 2024/0072080 A1 Feb. 29, 2024

(30) Foreign Application Priority Data
Jan. 27, 2021 (JP) ................................ 2021-011535

(51) Int. Cl.
*G01S 7/48* (2006.01)
*G01S 7/481* (2006.01)
(Continued)

(52) U.S. Cl.
CPC ........ *H10F 39/8033* (2025.01); *G01S 7/4816* (2013.01); *G01S 17/08* (2013.01);
(Continued)

(58) Field of Classification Search
USPC ........................................................ 356/4.01
See application file for complete search history.

(56) References Cited

U.S. PATENT DOCUMENTS 6,184,538 B1 * 2/2001 Bandara ............. H10F 39/1847 438/66
10,446,601 B2 * 10/2019 Otake ................ H10F 39/8027
(Continued)

FOREIGN PATENT DOCUMENTS

CA 2306212 C * 3/2004 ............ H10F 77/14
JP 2019102675 A 6/2019
(Continued)

OTHER PUBLICATIONS

English Translation of the Written Opinion of the International Search Authority for PCT/JP2022/000991 (Year: 2022).*
(Continued)

*Primary Examiner* — James R Hulka
(74) *Attorney, Agent, or Firm* — Michael Best & Friedrich LLP

(57) ABSTRACT

A light detection device according to an embodiment of the present disclosure includes: a semiconductor substrate that includes a first surface and a second surface opposed to each other, and includes a pixel array in which a plurality of pixels is disposed in an array; a semiconductor layer that is provided on a side of the first surface of the semiconductor substrate; a light receiver that is provided inside the semiconductor substrate for each of the pixels, and generates carriers corresponding to a received light amount by photoelectric conversion; a multiplier that includes a first conduction-type region and a second conduction-type region sequentially stacked on the side of the first surface, at least the second conduction-type region being provided in the semiconductor layer, and that performs avalanche multiplication on the carriers generated by the light receiver; a first
(Continued)

electrode that is provided on the side of the first surface, and is electrically coupled to the light receiver; and a second electrode that is provided on the side of the first surface, and is electrically coupled to the multiplier.

20 Claims, 20 Drawing Sheets

(51) Int. Cl.
*G01S 17/08* (2006.01)
*H10F 39/00* (2025.01)

(52) U.S. Cl.
CPC ..... *H10F 39/8057* (2025.01); *H10F 39/8067* (2025.01); *H10F 39/807* (2025.01)

(56) References Cited

U.S. PATENT DOCUMENTS

| | | | | |
|---|---|---|---|---|
| 10,777,597 | B2 * | 9/2020 | Ogi | H10F 39/182 |
| 11,404,595 | B2 * | 8/2022 | Wakano | H04N 25/773 |
| 12,046,618 | B2 * | 7/2024 | Otake | H10F 77/331 |
| 2019/0006399 | A1 * | 1/2019 | Otake | H10F 39/811 |
| 2019/0157323 | A1 * | 5/2019 | Ogi | H10F 39/199 |
| 2020/0295218 | A1 * | 9/2020 | Wakano | H10F 77/148 |
| 2022/0020789 | A1 * | 1/2022 | Otake | H10F 39/8057 |
| 2024/0072080 | A1 * | 2/2024 | Otake | G01S 17/08 |

FOREIGN PATENT DOCUMENTS

| | | | |
|---|---|---|---|
| WO | 2018074530 | A1 | 4/2018 |
| WO | 2018174090 | A1 | 9/2018 |

OTHER PUBLICATIONS

International Search Report (PCT/ISA/210), International Application No. PCT/JP2022/000991, dated Apr. 5, 2022.

* cited by examiner

[ FIG. 2 ]
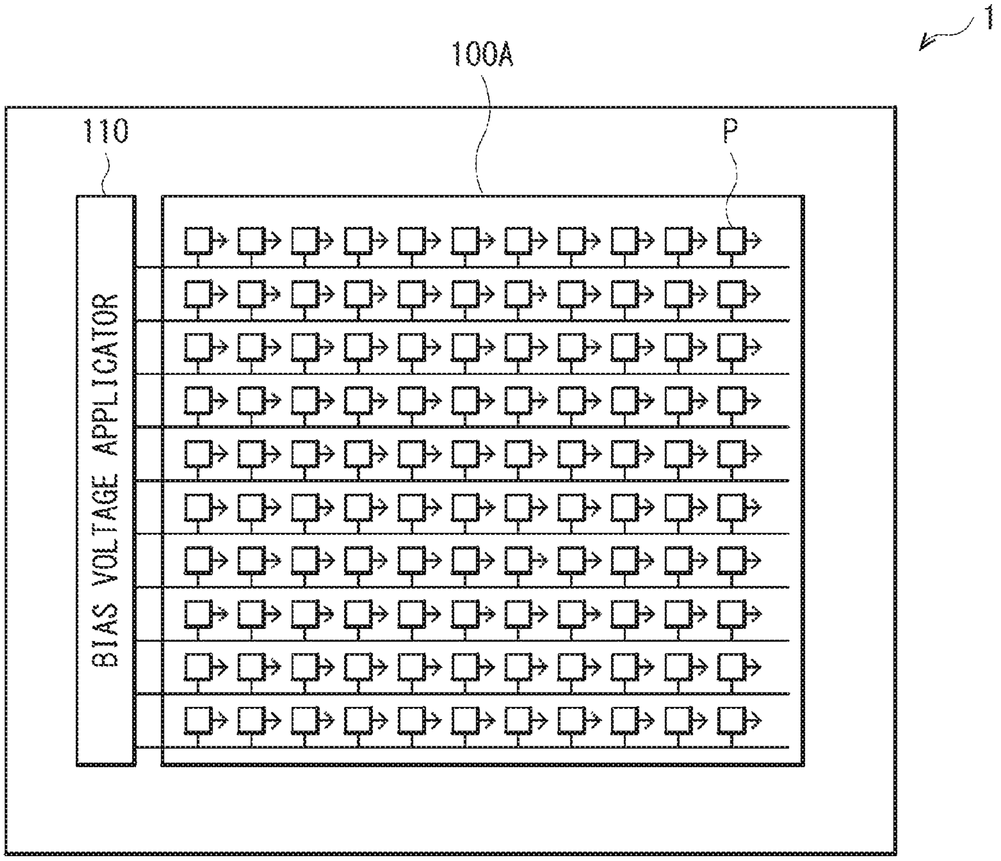
[ FIG. 3 ]
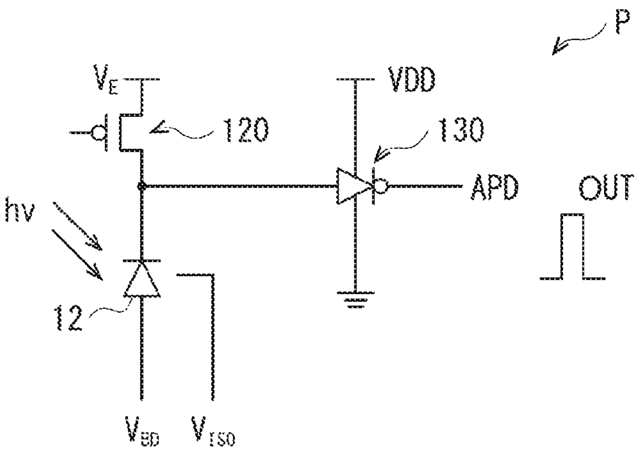

[ FIG. 4 ]
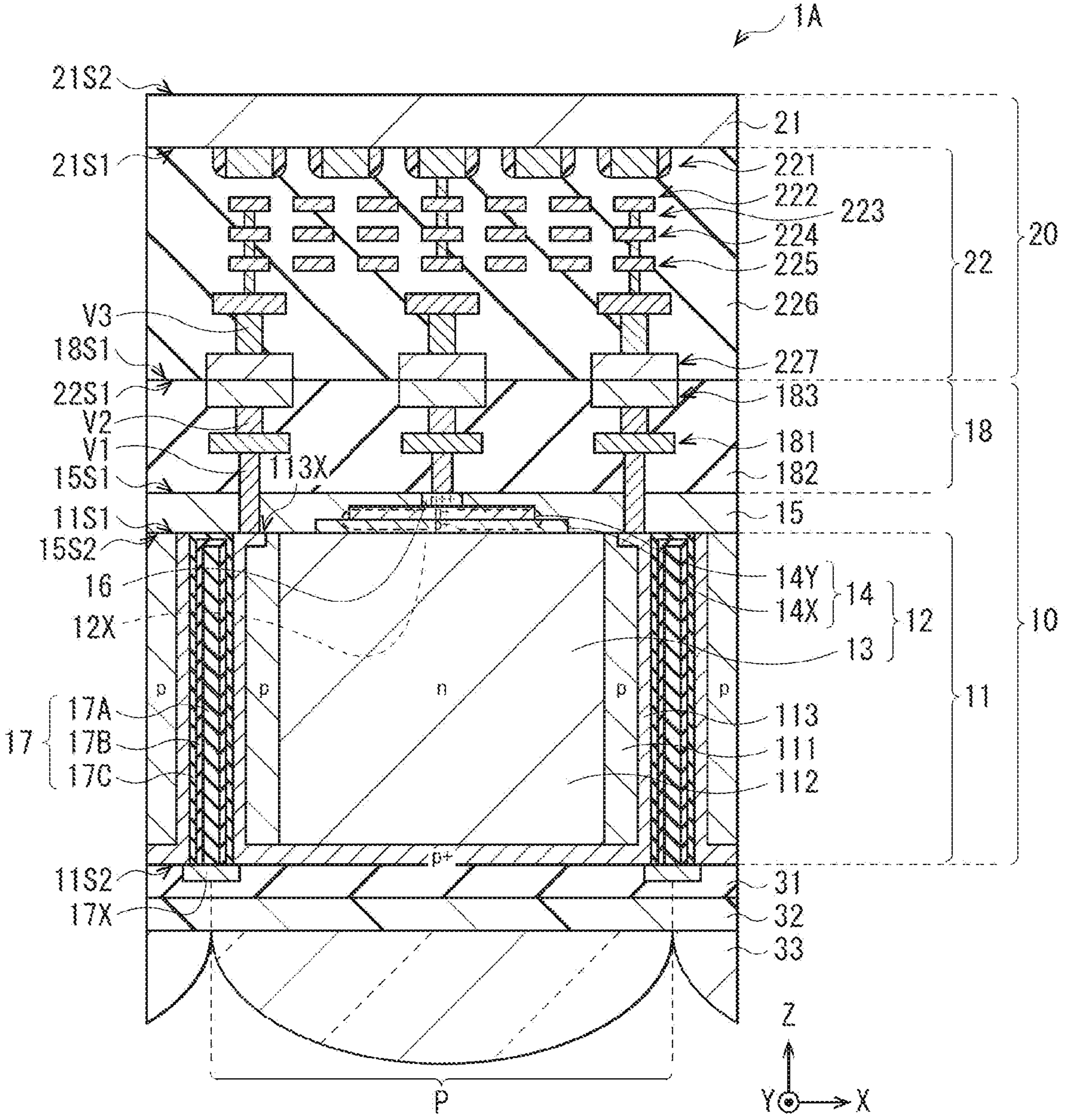

[ FIG. 5 ]
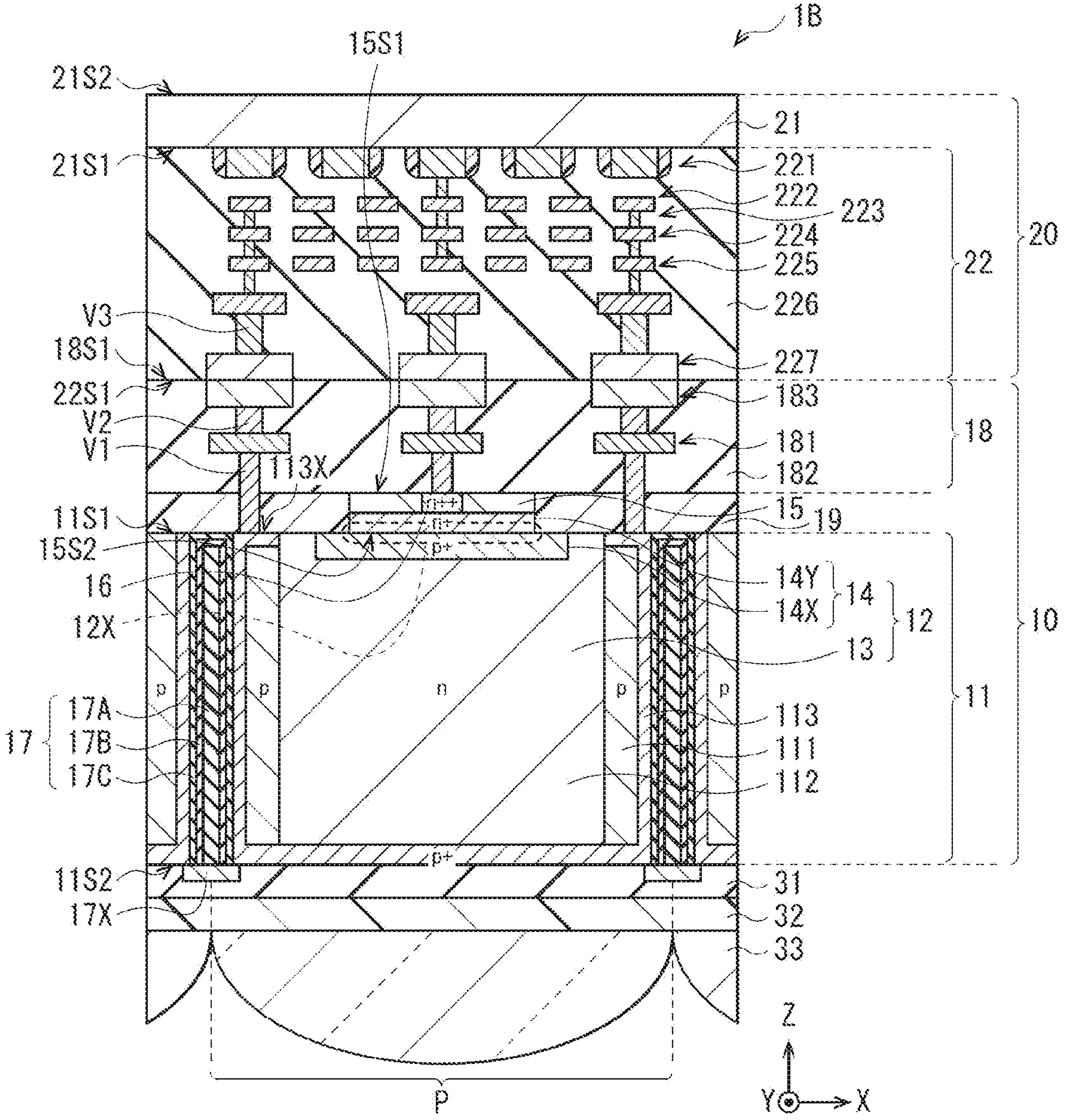

[ FIG. 6A ]
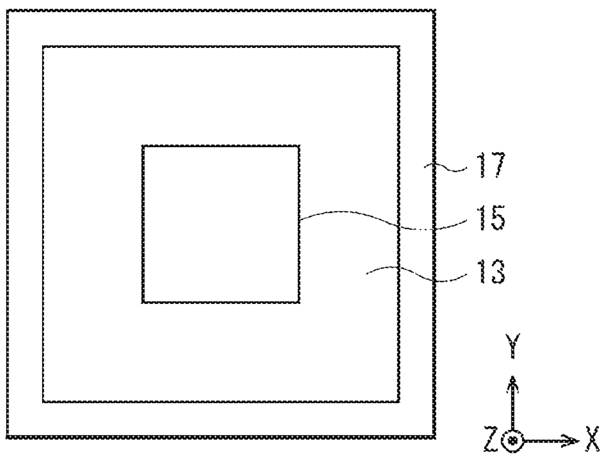
[ FIG. 6B ]
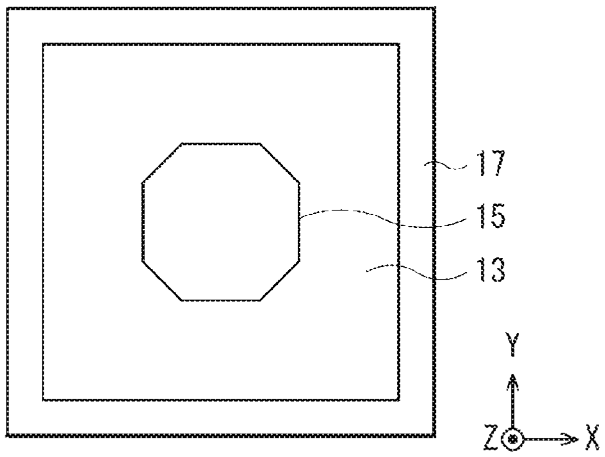
[ FIG. 6C ]
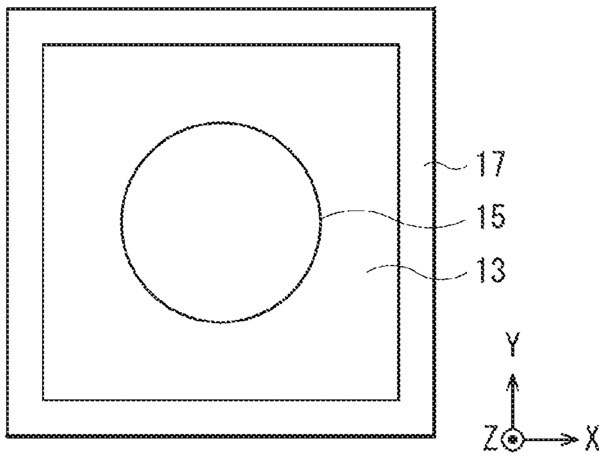

[ FIG. 7 ]
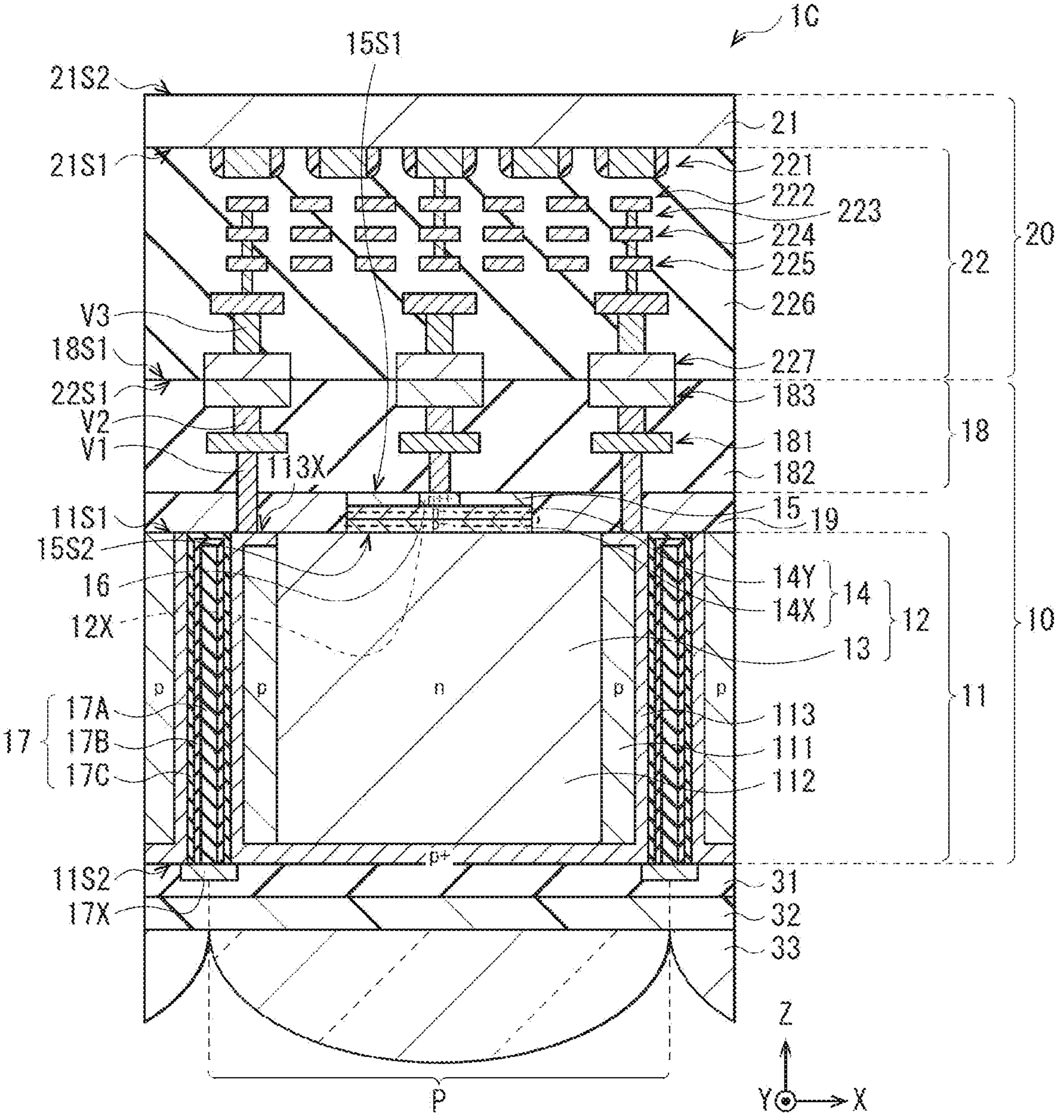

[ FIG. 8 ]
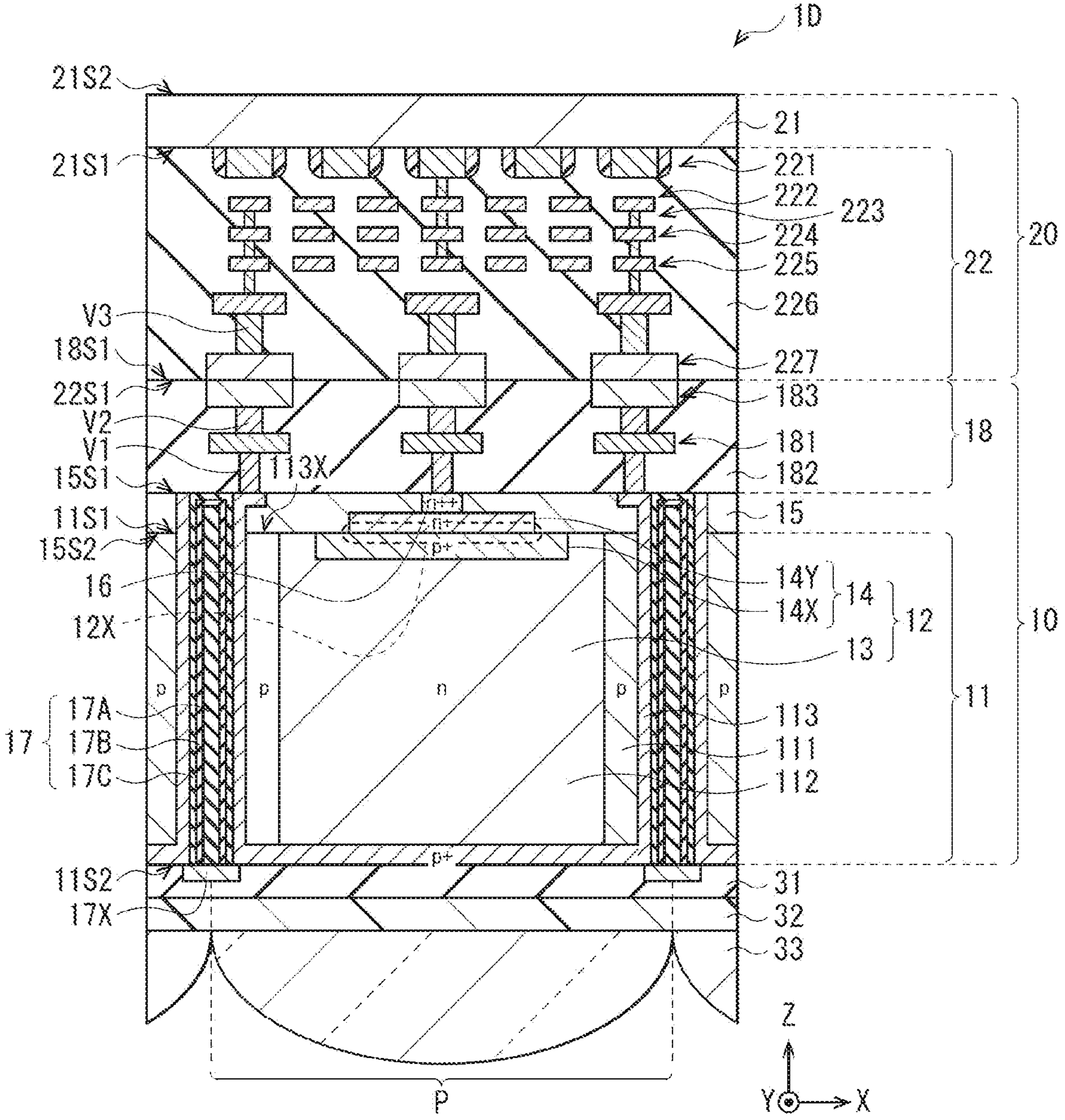

[ FIG. 9 ]
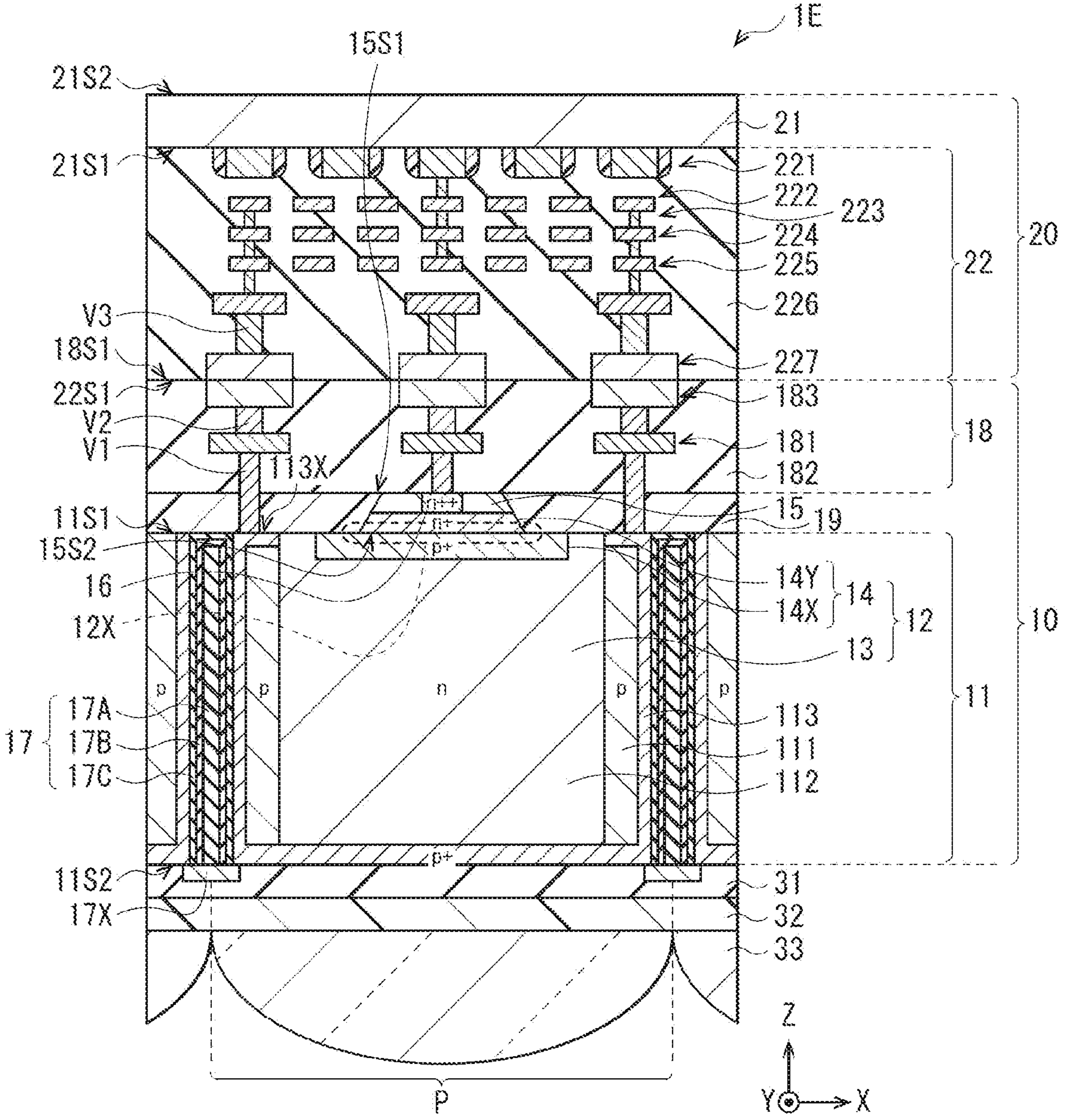

[ FIG. 10 ]
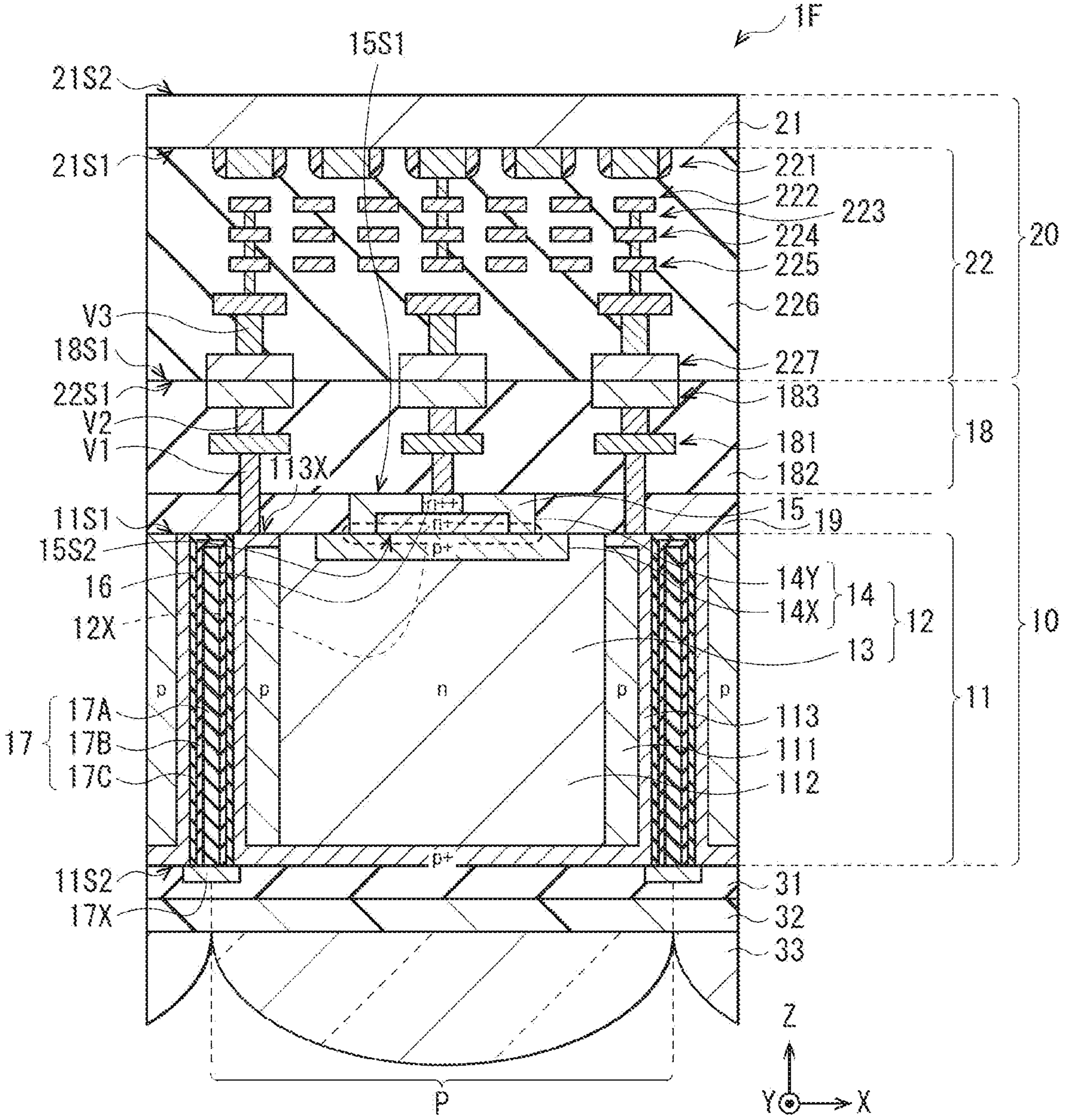

[ FIG. 11 ]
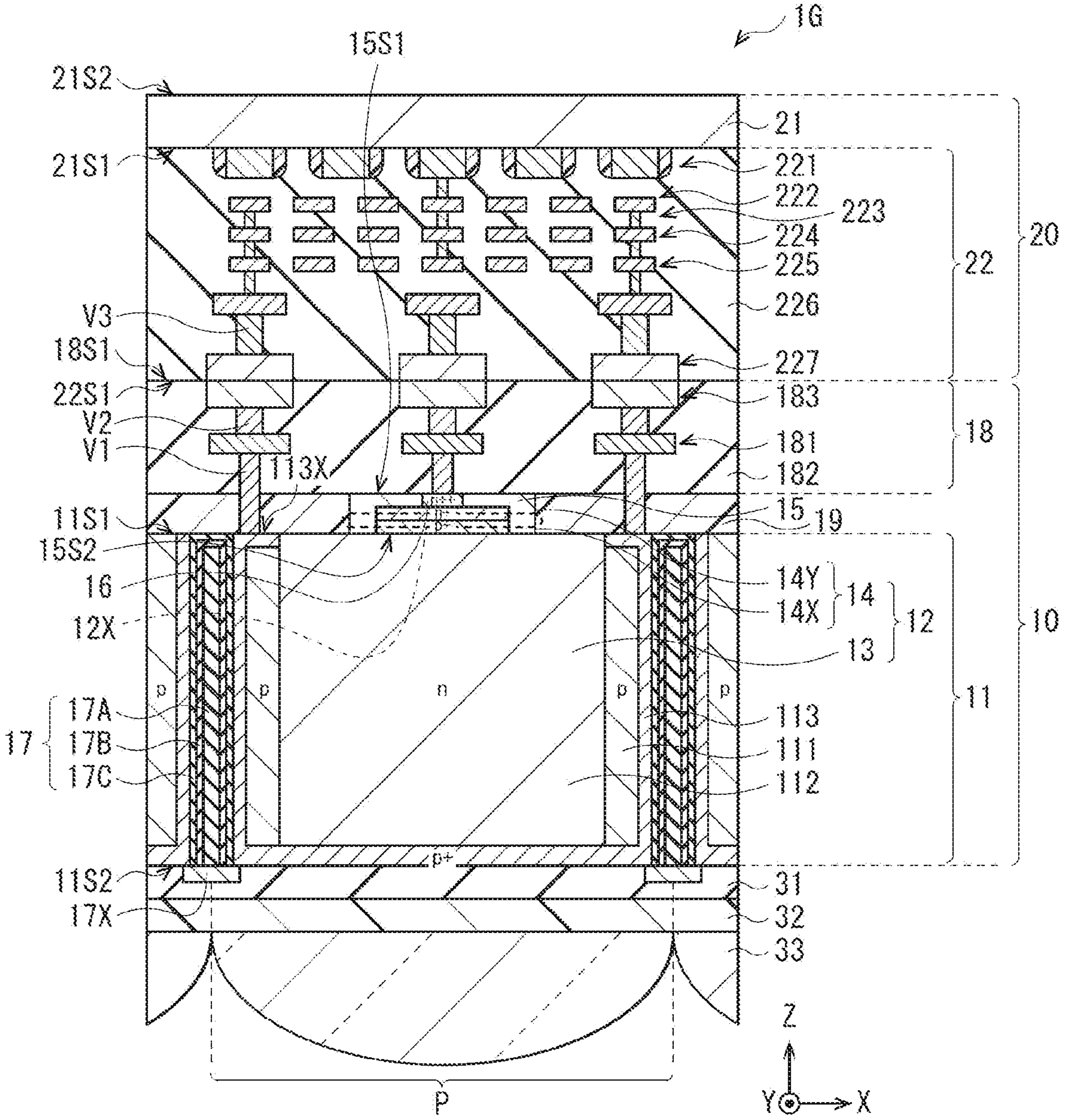

[ FIG. 12 ]
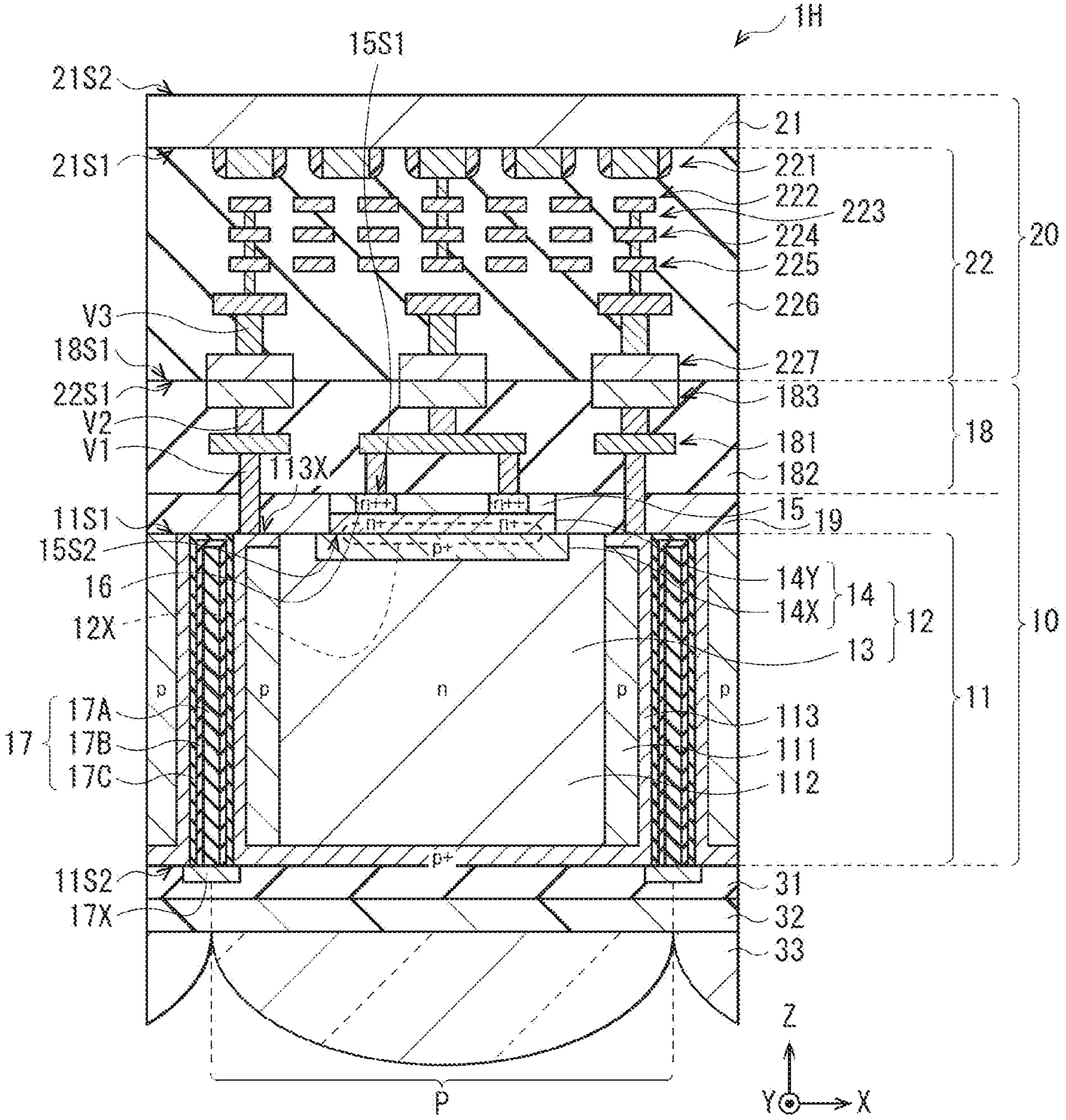

[ FIG. 13 ]
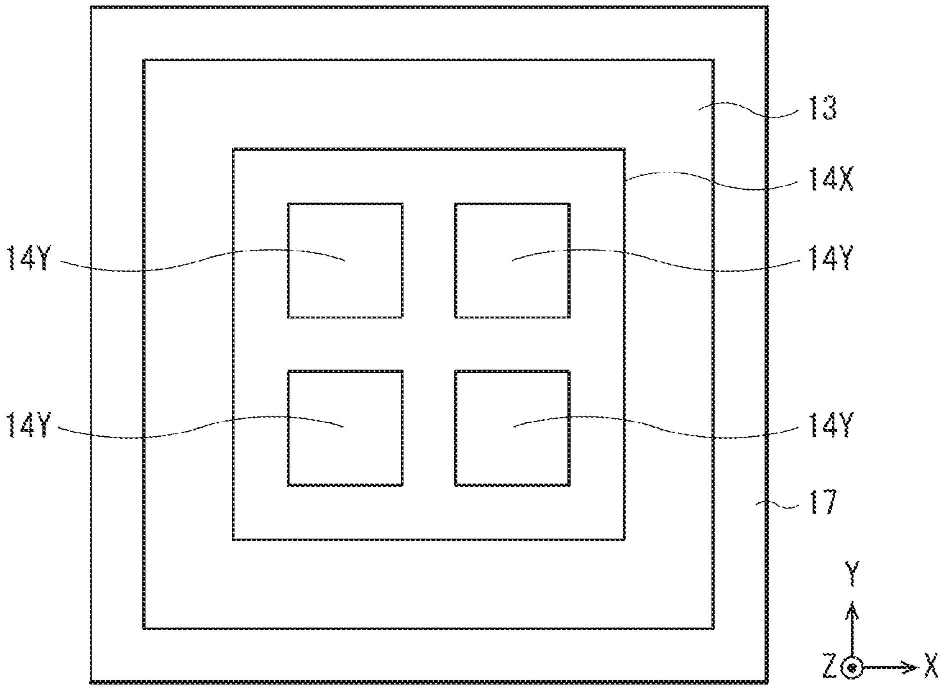

[ FIG. 14 ]
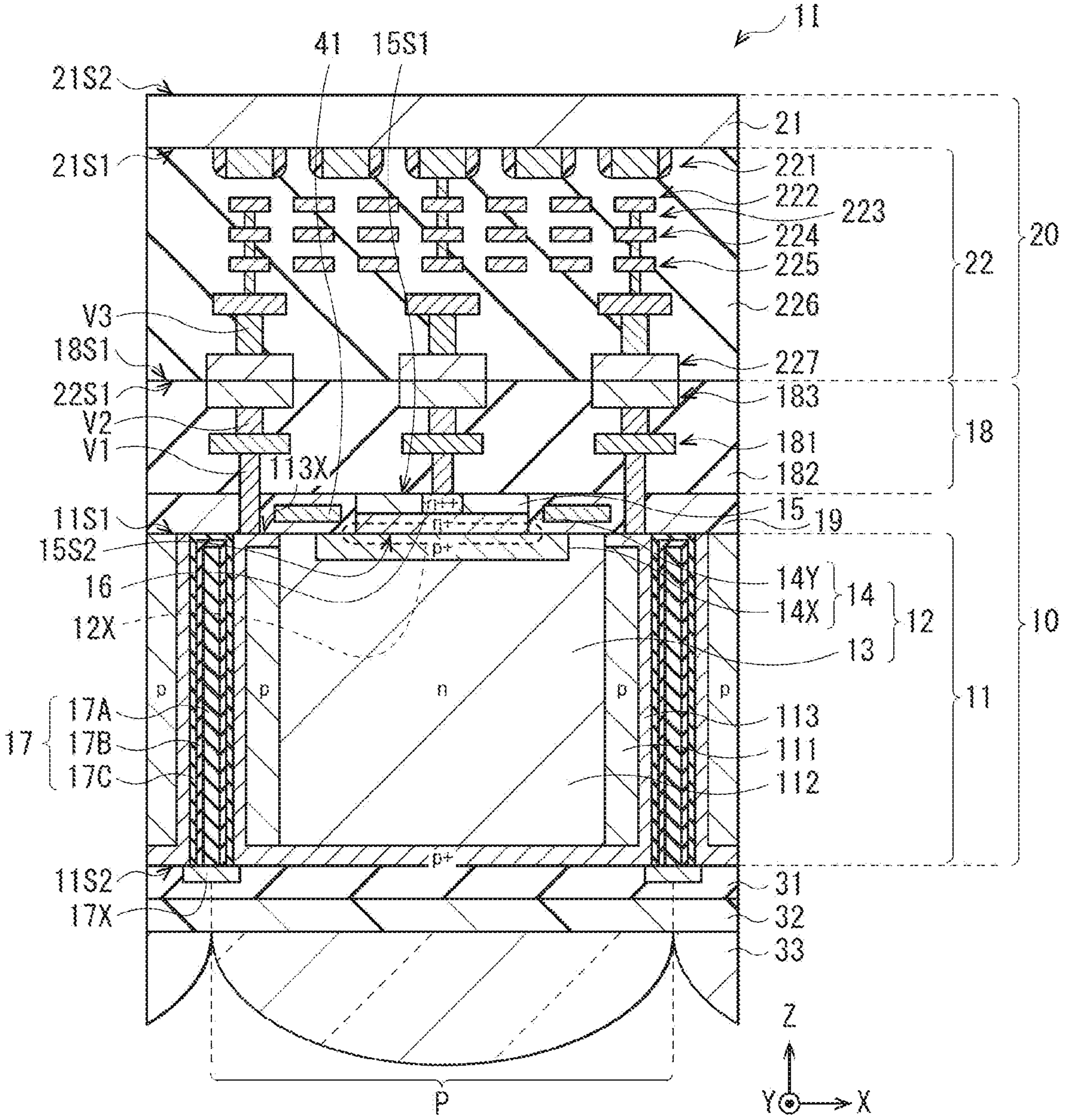

[ FIG. 15 ]
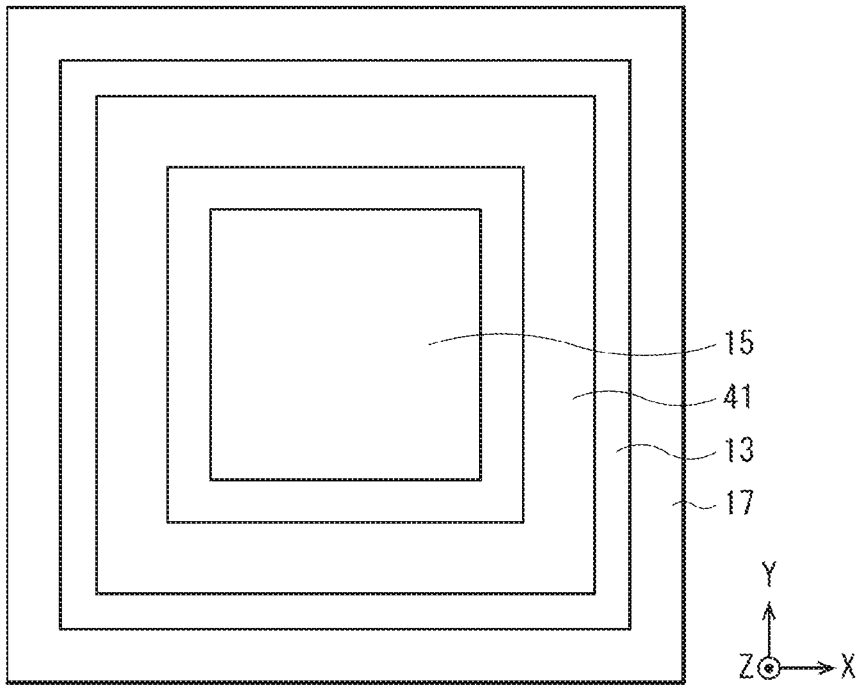

[ FIG. 16 ]
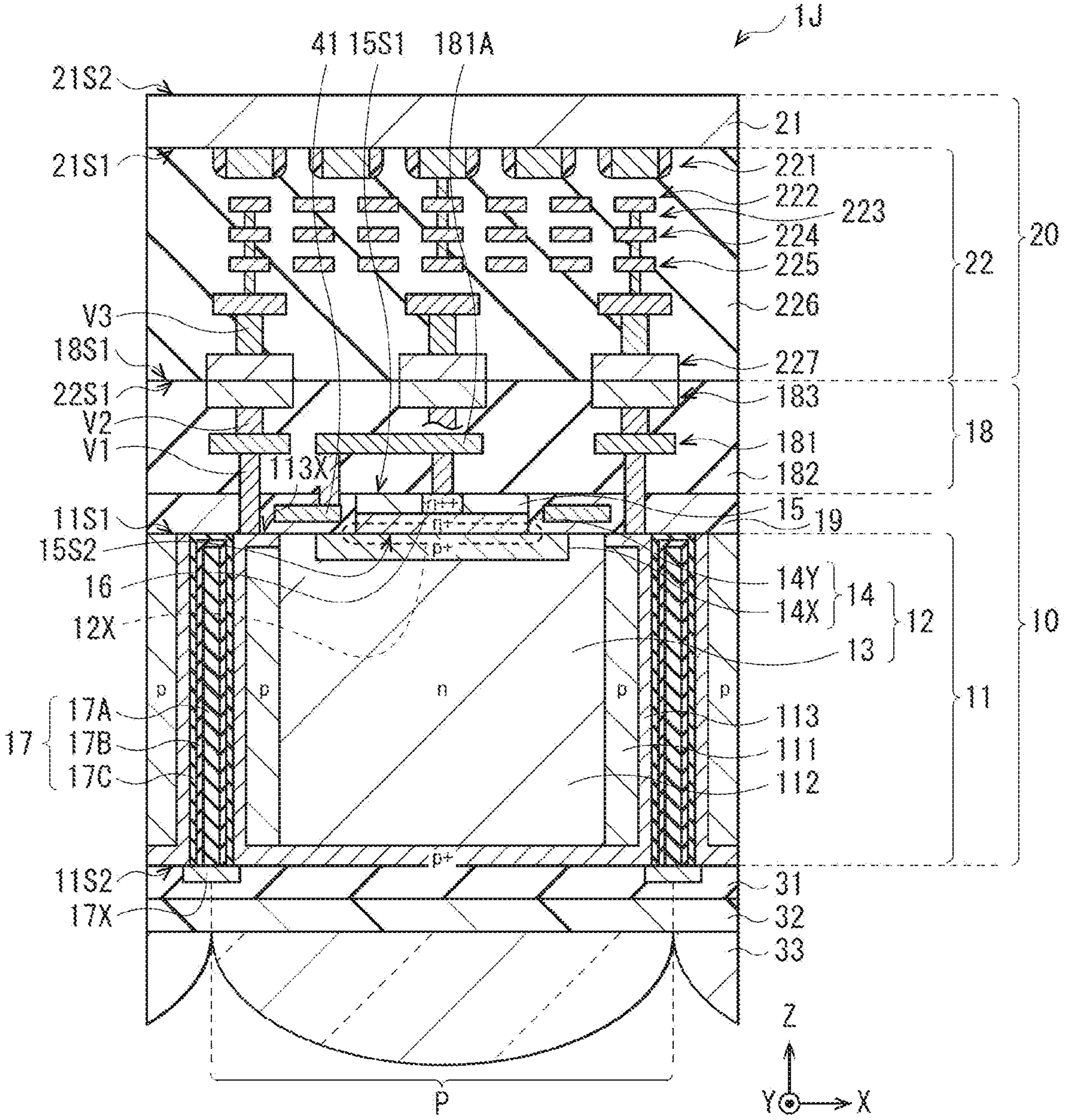

[ FIG. 17 ]
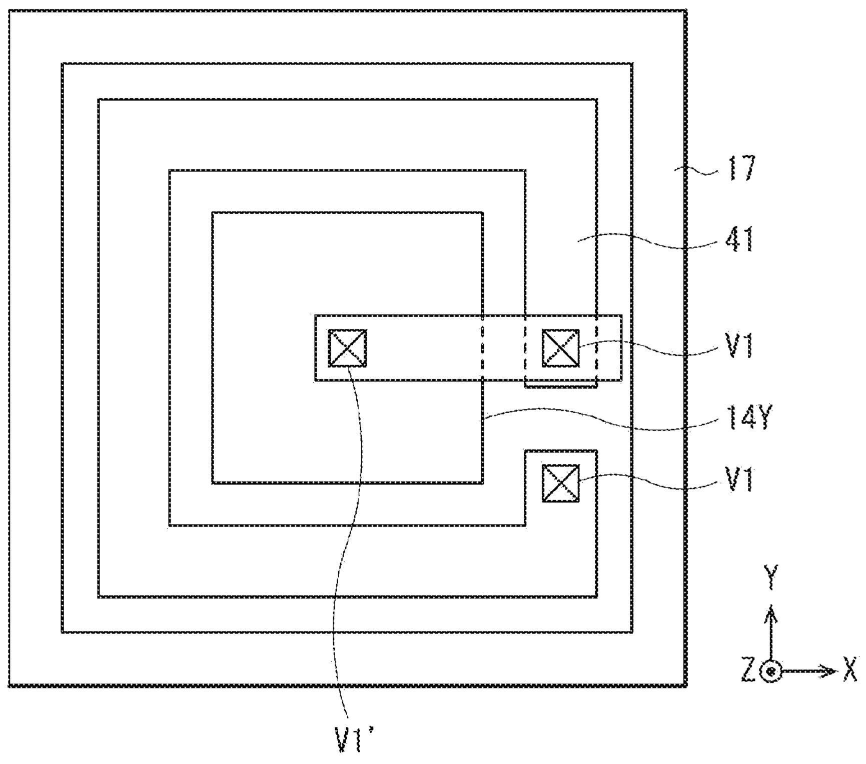

[ FIG. 18 ]
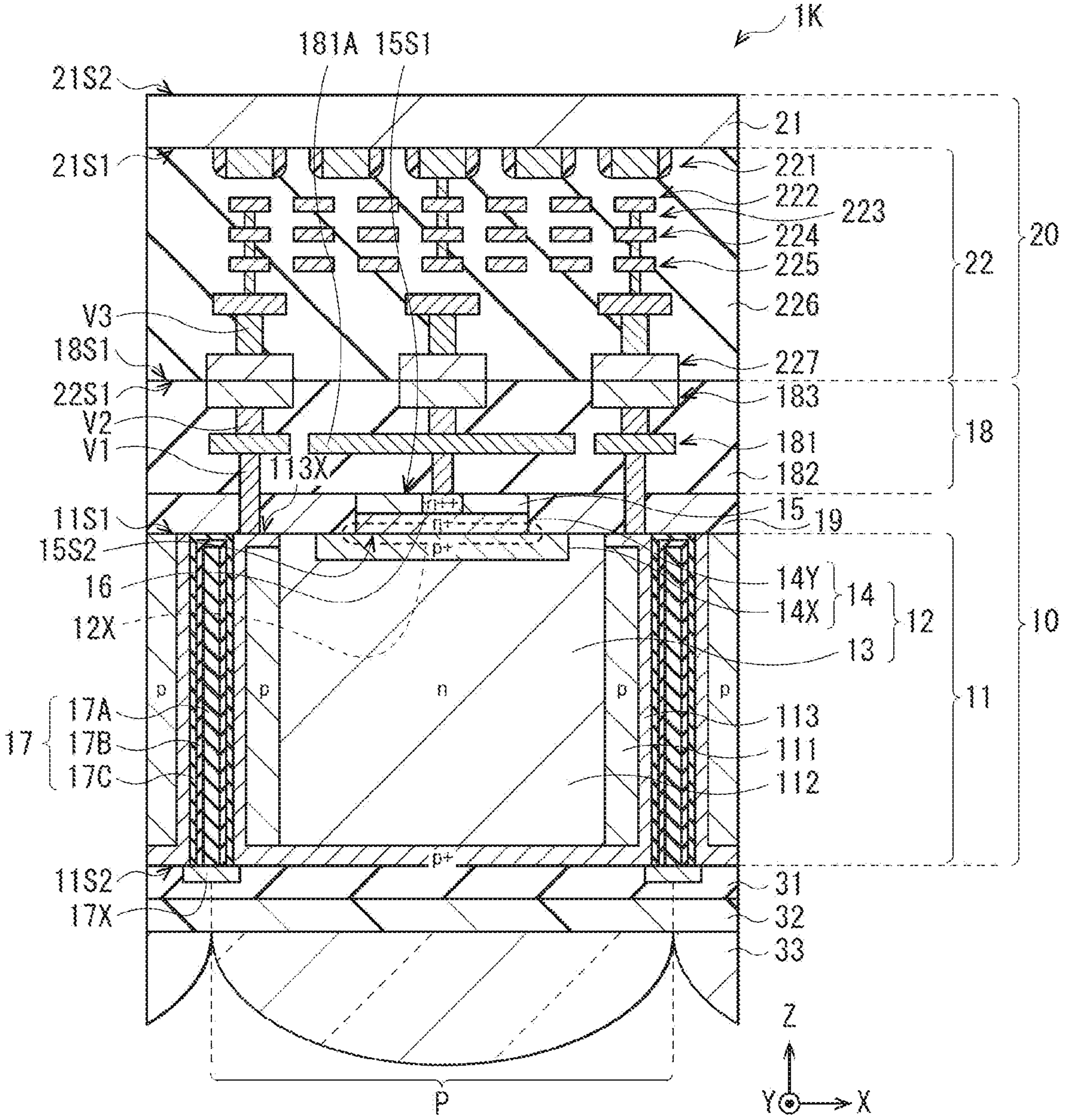

[ FIG. 21 ]
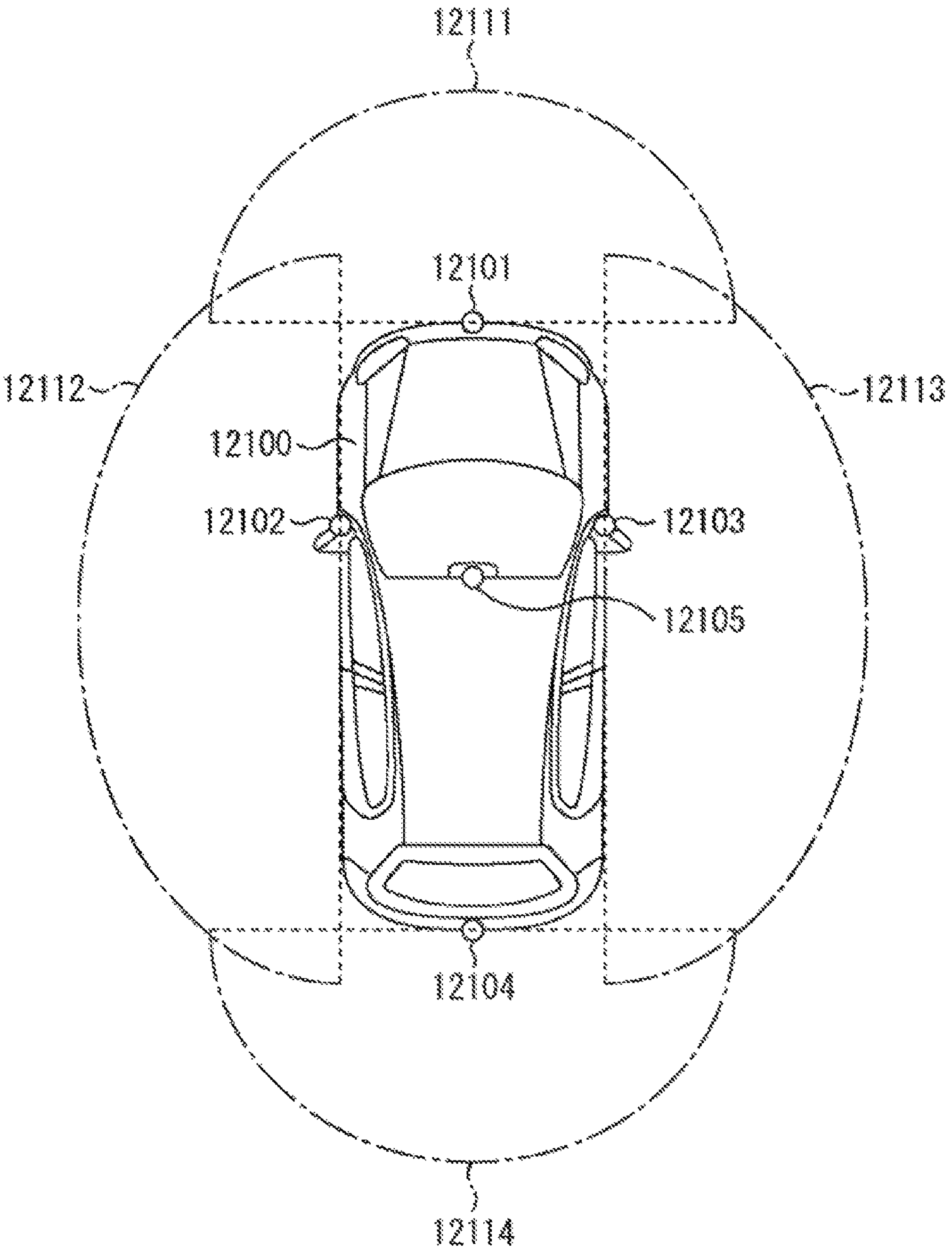

LIGHT DETECTION DEVICE AND DISTANCE MEASUREMENT APPARATUS

TECHNICAL FIELD

The present disclosure relates to: a light detection device including, for example, an avalanche photodiode; and a distance measurement apparatus including the light detection device.

BACKGROUND ART

For example, PTL 1 discloses a light detection device in which an avalanche photodiode is provided for each pixel, and the pixel is isolated from an adjacent pixel by being provided with a semiconductor region that surrounds the avalanche photodiode.

CITATION LIST

Patent Literature

PTL 1: International Publication No. WO 2018/074530

SUMMARY OF THE INVENTION

Accordingly, in a light detection device included in a distance measurement apparatus, suppression of unintended edge breakdown is demanded.

It is desirable to provide a light detection device and a distance measurement apparatus which make it possible to suppress unintended edge breakdown.

A light detection device according to an embodiment of the present disclosure includes: a semiconductor substrate that includes a first surface and a second surface opposed to each other, and includes a pixel array in which a plurality of pixels is disposed in an array; a semiconductor layer that is provided on a side of the first surface of the semiconductor substrate; a light receiver that is provided inside the semiconductor substrate for each of the pixels, and generates carriers corresponding to a received light amount by photoelectric conversion; a multiplier that includes a first conduction-type region and a second conduction-type region sequentially stacked on the side of the first surface, at least the second conduction-type region being provided in the semiconductor layer, and that performs avalanche multiplication on the carriers generated by the light receiver; a first electrode that is provided on the side of the first surface, and is electrically coupled to the light receiver; and a second electrode that is provided on the side of the first surface, and is electrically coupled to the multiplier.

A distance measurement apparatus according to an embodiment of the present disclosure includes an optical system, a light detection device, and a signal processing circuit that calculates a distance to a measurement object on the basis of an output signal from the light detection device. The light detection device includes the above-described light detection device according to the embodiment of the present disclosure.

According to the light detection device of the embodiment of the present disclosure and the distance measurement apparatus of the embodiment of the present disclosure, the semiconductor layer is provided on the side of the first surface of the semiconductor substrate, the semiconductor substrate having the first surface and the second surface that are opposed to each other, and at least the second conduction-type region, out of the first conduction-type region and the second conduction-type region that are included in the multiplier, is provided in the semiconductor layer. Thus, a distance between the first electrode electrically coupled to the light receiver and the second conduction-type region included in the multiplier is ensured.

BRIEF DESCRIPTION OF DRAWINGS

FIG. 2 is a block diagram illustrating an example of a schematic configuration of the light detection device illustrated in FIG. 1.

FIG. 3 is an example of an equivalent circuit diagram of unit pixels of the light detection device illustrated in FIG. 1.

FIG. 4 is a cross-sectional schematic view of a configuration example of a light detection device according to Modification example 1 of the present disclosure.

FIG. 5 is a cross-sectional schematic view of a configuration example of a light detection device according to Modification example 2 of the present disclosure.

FIG. 6A is a schematic view of an example of a planar shape of a semiconductor layer in a unit pixel of the light detection device illustrated in FIG. 5.

FIG. 6B is a schematic view of another example of the planar shape of the semiconductor layer in the unit pixel of the light detection device illustrated in FIG. 5.

FIG. 6C is a schematic view of another example of the planar shape of the semiconductor layer in the unit pixel of the light detection device illustrated in FIG. 5.

FIG. 7 is a cross-sectional schematic view of a configuration example of a light detection device according to Modification example 3 of the present disclosure.

FIG. 8 is a cross-sectional schematic view of a configuration example of a light detection device according to Modification example 4 of the present disclosure.

FIG. 9 is a cross-sectional schematic view of a configuration example of a light detection device according to Modification example 5 of the present disclosure.

FIG. 10 is a cross-sectional schematic view of a configuration example of a light detection device according to Modification example 6 of the present disclosure.

FIG. 11 is a cross-sectional schematic view of a configuration example of a light detection device according to Modification example 7 of the present disclosure.

FIG. 12 is a cross-sectional schematic view of a configuration example of a light detection device according to Modification example 8 of the present disclosure.

FIG. 13 is a plan schematic view of a planar layout example of a p-type semiconductor region and an n-type semiconductor region in a unit pixel of the light detection device illustrated in FIG. 12.

FIG. 14 is a cross-sectional schematic view of a configuration example of a light detection device according to Modification example 9 of the present disclosure.

FIG. 15 is a plan schematic view of an example of a layout of a reflection layer in a unit pixel of the light detection device illustrated in FIG. 14.

FIG. 16 is a cross-sectional schematic view of a configuration example of a light detection device according to Modification example 10 of the present disclosure.

FIG. 17 is a plan schematic view of an example of a wiring layout with respect to a reflection layer in a unit pixel of the light detection device illustrated in FIG. 16.

FIG. 18 is a cross-sectional schematic view of a configuration example of a light detection device according to Modification example 11 of the present disclosure.

FIG. 19 is a functional block diagram illustrating an example of an electronic apparatus including the light detection device illustrated in FIG. 1 or the like.

FIG. 21 is a diagram of assistance in explaining an example of installation positions of an outside-vehicle information detecting section and an imaging section.

MODES FOR CARRYING OUT THE INVENTION

Figure 1:
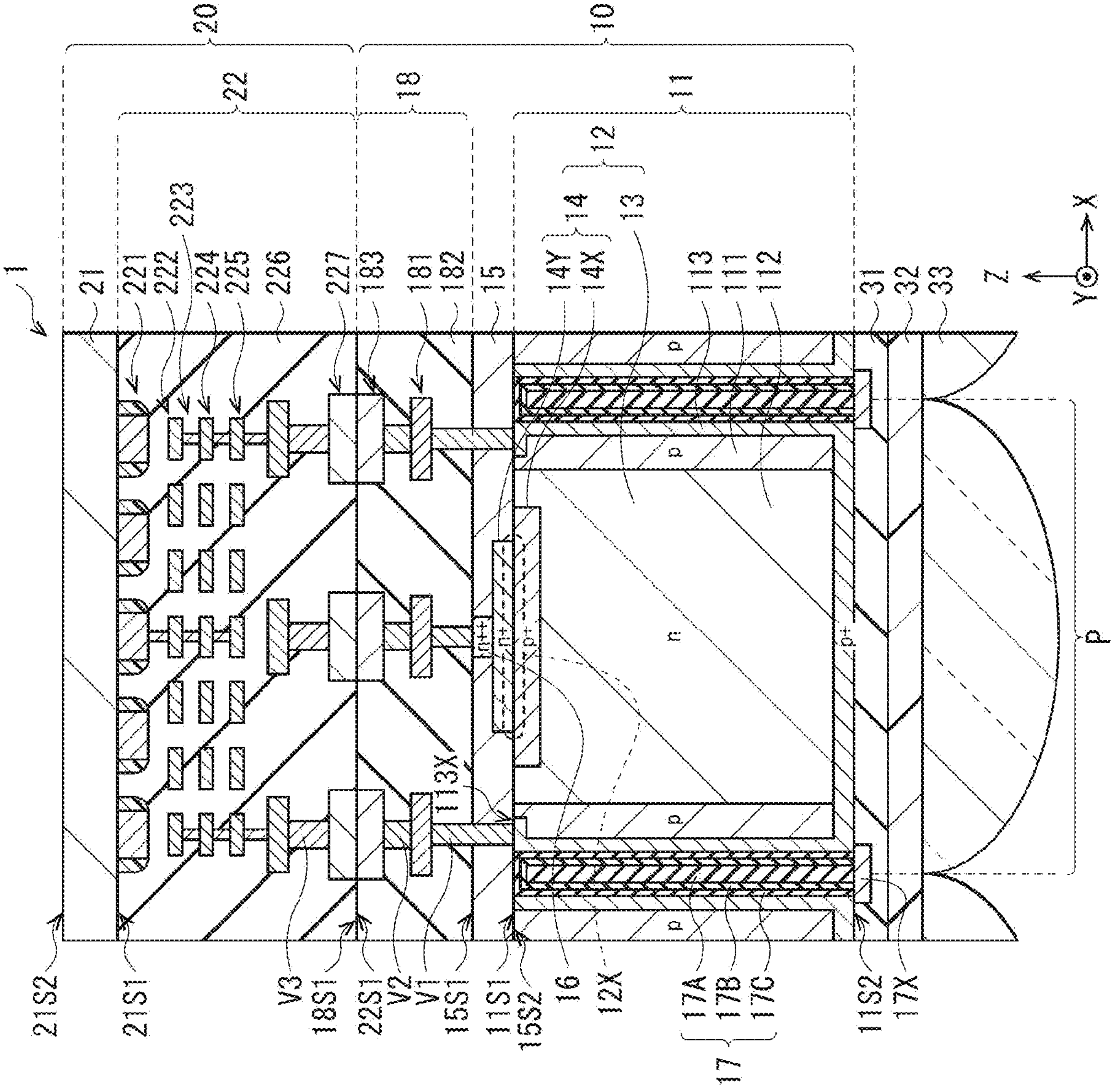
FIG. 1 is a cross-sectional schematic view of a configuration example of a light detection device according to an embodiment of the present disclosure.

The following describes embodiments of the present disclosure in detail with reference to the drawings. The following description is a specific example of the present disclosure, but the present disclosure is not limited to the following embodiments. In addition, the present disclosure is not limited to arrangement, dimensions, dimensional ratios, and the like of the components illustrated in the drawings. It is to be noted that description is given in the following order.

1. Embodiment
(A light detection device in which an n-type semiconductor region included in a multiplier is provided in a semiconductor layer provided on a semiconductor substrate)
1-1. Configuration of Light Detection Device
1-2. Method of Manufacturing Light Detection Device
1-3. Workings and Effects
2. Modification Examples
2-1. Modification Example 1
(An example in which the n-type semiconductor region and a p-type semiconductor region included in the multiplier is provided in the semiconductor layer)
2-2. Modification Example 2
(An example in which the semiconductor layer is provided for each pixel and an insulating layer is provided around the semiconductor layer)
2-3. Modification Example 3
(An example in which the n-type semiconductor region and the p-type semiconductor region included in the multiplier are provided in the semiconductor layer provided for each pixel)
2-4. Modification Example 4
(An example in which a pixel separator protrudes into the semiconductor layer)
2-5. Modification Example 5
(An example in which a side surface of the semiconductor layer is an inclined surface)
2-6. Modification Example 6
(An example in which the n-type semiconductor region included in the multiplier is provided on an inner side relative to the side surface of the semiconductor layer)
2-7. Modification Example 7
(An example in which the n-type semiconductor region and the p-type semiconductor region included in the multiplier are provided on the inner side relative to the side surface of the semiconductor layer)
2-8. Modification Example 8
(An example in which a plurality of n-type semiconductor regions included in the multiplier is provided in the semiconductor layer)
2-9. Modification Example 9
(An example in which a reflection layer is provided in the insulating layer surrounding the semiconductor layer)
2-10. Modification Example 10
(An example in which the reflection layer is used as a resistor of a readout circuit)
2-11. Modification Example 11
(An example in which a wiring line in a multilayer wiring layer serves as the reflection layer)
3. Application Example
4. Practical Application Example

1. Embodiment

FIG. 1 schematically illustrates an example of a cross-sectional configuration of a light detection device (a light detection device 1) according to an embodiment of the present disclosure. FIG. 2 is a block diagram illustrating a schematic configuration of the light detection device 1 illustrated in FIG. 1, and FIG. 3 illustrates an example of an equivalent circuit of a unit pixel P of the light detection device 1 illustrated in FIG. 1. The light detection device 1 is to be applied to, for example, a distance image sensor (a distance image apparatus 1000 to be described later, see FIG. 19) that performs distance measurement by a ToF (Time-of-Flight) method, an image sensor, or the like.

1-1. Configuration of Light Detection Device

The light detection device 1 includes, for example, a pixel array 100A in which a plurality of unit pixels P is arrayed in a row direction and in a column direction. As illustrated in FIG. 2, the light detection device 1 includes a bias voltage applicator 110 together with the pixel array 100A. The bias voltage applicator 110 applies a biasing voltage to each unit pixel P in the pixel array 100A. In the present embodiment, an example in which electrons are read out as signal charges will be described.

As illustrated in FIG. 3, the unit pixel P includes a light receiving element 12, a quenching resistor 120 including a p-type MOSFET (Metal-Oxide-Semiconductor Field-Effect Transistor), and an inverter 130 including, for example, a complementary type MOSFET.

The light receiving element 12 converts incident light into an electric signal by photoelectric conversion and outputs the converted light. The light receiving element 12 collaterally converts the incident light (photon) into the electric signal by photoelectric conversion, and outputs a pulse corresponding to the incidence of the photon. The light receiving element 12 is, for example, a SPAD device, and the SPAD device has, for example, a characteristic that an avalanche multiplication region (a depletion layer) 12X is formed by a large negative voltage applied to a cathode, and electrons generated in response to the incidence of one photon cause avalanche multiplication and a large current flows. The light receiving element 12 has, for example, an anode coupled to the bias voltage applicator 110 and the cathode coupled to a source terminal of the quenching resistor 120. A device voltage $V_B$ is applied from the device voltage applicator to the anode of the light receiving element 12.

The quenching resistor 120 is coupled in series with the light receiving element 12, and has the source terminal coupled to the cathode of the light receiving element 12 and a drain terminal coupled to an unillustrated power supply. An excitation voltage $V_E$ is applied from the power source to the drain terminal of the quenching resistor 120. The quenching resistor 120 performs quenching in which the electrons multiplied by the light receiving element 12 are emitted when a voltage of electrons which have been subjected to the avalanche multiplication by the light receiving element 12 reach a negative voltage $V_{BD}$, to return the voltage to an initial voltage.

The inverter 130 has an input terminal coupled to the cathode of the light receiving element 12 and the source terminal of the quenching resistor 120, and an output terminal coupled to an unillustrated subsequent arithmetic processing unit. The inverter 130 outputs a light reception signal on the basis of the carriers (the signal charges) multiplied by the light receiving element 12. More specifically, the inverter 130 shapes the voltage generated by the electrons multiplied by the light receiving element 12. Thereafter, the inverter 130 outputs a light reception signal (APD OUT) in which a pulse waveform illustrated in FIG. 3 is generated, for example, with an arrival time of one font as a starting point to the arithmetic processing unit. For example, the arithmetic processing unit performs arithmetic processing for determining a distance to a subject on the basis of a timing at which the pulse indicating the arrival time of one font is generated in each light reception signal, and determines the distance for each unit pixel P. Thereafter, on the basis of the distances, a distance image in which the distances to the subject detected by the plurality of unit pixels P are arranged in a planar manner is generated.

The light detection device 1 is, for example, a so-called back-surface illumination-type light detection device in which a logic board 20 is stacked on a front surface side of a sensor board 10 (for example, a front surface (first surface 11S1) side of a semiconductor substrate 11 included in the sensor board 10), and receives light from a back surface side of the sensor board 10 (for example, a back surface (second surface 11S2) side of the semiconductor substrate 11 included in the sensor board 10). The light detection device 1 according to the present embodiment includes the light receiving element 12 for each unit pixel P. The light receiving element 12 includes a light receiver 13 and a multiplier 14, and the light receiver 13 is embedded and formed in the semiconductor substrate 11. The semiconductor substrate 11 further includes, out of a p-type semiconductor region ($p^+$) 14X and an n-type semiconductor region ($n^+$) 14Y included in the multiplier 14, the p-type semiconductor region ($p^+$) 14X on the first surface 11S1. A semiconductor layer 15 is provided on the first surface 11S1 side of the semiconductor substrate 11, and the n-type semiconductor region ($n^+$) 14Y included in the multiplier 14 is provided on the semiconductor layer 15.

In the drawings, the symbols "p" and "n" represent the p-type semiconductor region and the n-type semiconductor region, respectively. In addition, the "+" or "−" at the end of "p" indicates an impurity concentration of the p-type semiconductor region. Similarly, "+" or "−" at the end of "n" indicates an impurity concentration of the n-type semiconductor region. Here, the larger the number of "+", the higher the impurity concentration, and the larger the number of "−", the lower the impurity concentration. The same applies to the following drawings.

The sensor board 10 includes, for example, the semiconductor substrate 11 including a silicon substrate, a semiconductor layer 15, and a multilayer wiring layer 18. The semiconductor substrate 11 has the first surface 11S1 and the second surface 11S2 that are opposed to each other. The semiconductor substrate 11 includes a p-well (p) 111 which is common for the plurality of unit pixels P. The semiconductor substrate 11 is provided for each unit pixel P with, for example, an n-type semiconductor region (n) 112 in which the impurity concentration is controlled to be in the n-type, whereby a light receiving element 12 is formed for each unit pixel P. The semiconductor substrate 11 is further provided with a pixel separator 17 extending between the first surface 1S1 and the second surface 11S2.

The light receiving element 12 has a multiplication region (the avalanche multiplication region) for performing the avalanche multiplication on the carriers by a high electric field region, and as described above, is the SPAD device that is able to form the avalanche multiplication region (the depletion layer) by a large positive voltage applied to the cathode, and able to perform the avalanche multiplication on electrons generated by the incidence of one photon.

The light receiving element 12 includes the light receiver 13 and the multiplier 14.

The light receiver 13 corresponds to a specific example of a "light receiver" according to the present disclosure. The light receiver 13 has a photoelectric converting function of absorbing light that enters from the second surface 11S2 side of the semiconductor substrate 11 and generating carriers corresponding to the received light amount. As described above, the light receiver 13 includes the n-type semiconductor region (n) 112 whose impurity concentration is controlled in an n-type, and carriers (electrons) generated by the light receiver 13 are transferred to the multiplier 14 by a potential gradient.

The multiplier 14 corresponds to a specific example of a "multiplier" according to the present disclosure. The multiplier 14 performs avalanche multiplication on carriers (here, electrons) generated by the light receiver 13. The multiplier 14 includes, for example, the p-type semiconductor region ($p^+$) 14X having an impurity concentration higher than that of the p-well (p) 111 and the n-type semiconductor region ($n^+$) 14Y having an impurity concentration higher than that of the n-type semiconductor region (n) 112. The p-type semiconductor region ($p^+$) 14X is provided in the semiconductor substrate 11 facing the first surface 11S1. The n-type semiconductor region ($n^+$) 14Y is provided in a protruding manner from the first surface 11S1 of the semiconductor substrate 11. Specifically, as described above, the n-type semiconductor region ($n^+$) 14Y is formed to be embedded in the semiconductor layer 15 provided on the first surface of the semiconductor substrate 11, in such a manner as to face a second surface 15S2 of the semiconductor layer 15.

In the light receiving element 12, an avalanche multiplication region 12X is formed at a junction between the p-type semiconductor region ($p^+$) 14X facing the first surface 11S1 of the semiconductor substrate 11 and the n-type semiconductor region ($n^+$) 14Y facing the second surface 15S2 of the semiconductor layer 15. The avalanche multiplication region 12X is a high electric field region (the depletion layer) formed at the interface between the p-type semiconductor region ($p^+$) 14X and the n-type semiconductor region ($n^+$) 14Y by a large negative voltage applied to the cathode. In the avalanche multiplication region 12X, the electrons ($e^-$) generated by one photon entering the light receiving element 12 are multiplied.

The semiconductor layer 15 is, for example, a semiconductor layer including, for example, silicon, which is formed on the first surface 11S1 of the semiconductor substrate 11 using, for example, an epitaxial crystal-growth method, and corresponds to a specific example of a "semiconductor layer" according to the present disclosure. The semiconductor layer 15 has a first surface 15S1 and the second surface 15S2. The first surface 15S1 faces the multilayer wiring layer 18 and the second surface 15S2 faces the semiconductor substrate 11. As described above, the n-type semiconductor region ($n^+$) 14Y is formed to be embedded in the semiconductor layer 15, in such a manner as to face the second surface 15S2.

The semiconductor layer 15 is further provided with a contact electrode 16 that electrically couples the cathode corresponding to a specific example of a "second electrode" according to the present disclosure and the multiplier 14 to each other, on the n-type semiconductor region ($n^+$) 14Y facing the first surface 15S1. The contact electrode 16 includes, for example, an n-type semiconductor region ($n^{++}$) having an impurity concentration higher than that of the n-type semiconductor region ($n^+$) 14Y.

The pixel separator 17 electrically and/or optically separates unit pixels P that are adjacent to each other, and is arranged in a grid pattern, for example, in a pixel array 100A. The pixel separator 17 includes, for example, a light-shielding film 17A extending between the first surface 11S1 and the second surface 11S2 of the semiconductor substrate 11, and insulation films 17B and 17C provided between the light-shielding film 17A and the semiconductor substrate 11. The light-shielding film 17A has a light-shielding section 17X that is formed in an expanded manner on the second surface 11S2 of the semiconductor substrate 11. The light-shielding section 17X suppresses crosstalk of obliquely incident light between adjacent unit pixels P. The light-shielding film 17A and the light-shielding section 17X are each formed using, for example, a conductive material having a light-shielding property. Such a material include, for example, tungsten (W), silver (Ag), copper (Cu), aluminum (Al), or an alloy of Al and copper (Cu). The insulation films 17B and 17C each include, for example, a silicon-oxide ($SiO_x$) film or the like.

A p-type semiconductor region ($p^+$) 113 having an impurity concentration higher than that of the p-well 111 is provided around the pixel separator 17. The p-type semiconductor region ($p^+$) 113 is expanded toward an inside of the unit pixel P near the first surface 11S1 of the semiconductor substrate 11 (an expansion section 113X). The expansion section 113X also serves as a contact electrode that electrically couples the anode corresponding to a specific example of a "first electrode" according to the present disclosure and the light receiver 13 to each other. The p-type semiconductor region ($p^+$) 113 further extends in the vicinity of the second surface 11S2 of the semiconductor substrate 11, for example, over the pixel array 100A.

A multilayer wiring layer 18 is provided on the first surface 1I side which is opposite to the side of the light incident surface (the second surface 11S2) of the semiconductor substrate 11) with the semiconductor layer 15 interposed therebetween. In the multilayer wiring layer 18, a wiring layer 181 including one or more wiring lines is formed in an interlayer insulating layer 182. The wiring layer 181 serves, for example, to supply a voltage to be applied to the semiconductor substrate 11 or the light receiving element 12, or to extract the carriers generated by the light receiving element 12. Some of the wiring lines in the wiring layer 181 are electrically coupled to the contact electrode 16 or the expansion section 113X via a via V1. A plurality of pad electrodes 183 is embedded in a front surface (a front surface 18S1 of the interlayer insulating layer 182), which is on an opposite side to the semiconductor substrate 11 side, of the interlayer insulating layer 182. The plurality of pad electrodes 183 is electrically coupled to some of the wiring lines in the wiring layer 181 via a via V2. It is to be noted that FIG. 1 illustrates an example in which one wiring layer 181 is formed in the multilayer wiring layer 18; however, the total number of wiring layers in the multilayer wiring layer 18 is not limited, and two or more wiring layers may be formed.

The interlayer insulating layer 182 includes, for example, a single-layer film including one of silicon oxide ($SiO_x$). TEOS, silicon nitride ($SiN_x$), silicon oxynitride ($SiO_xN_y$), or the like, or a stacked film including two or more of those.

The wiring layer 181 includes, for example, aluminum (Al), copper (Cu), tungsten (W), or the like.

The pad electrode 183 is exposed on a surface to be bonded to the logic board 20 (the front surface 18S1 of the multilayer wiring layer 18), and is used, for example, to be coupled to the logic board 20. The pad electrode 183 includes, for example, copper (Cu).

The logic board 20 includes, for example, a semiconductor substrate 21 including a silicon substrate, and a multilayer wiring layer 22. The logic board 20 includes a logic circuit which includes, for example, the above-described bias voltage applicator 110, a readout circuit that outputs a pixel signal based on the charges outputted from the unit pixels P of the pixel array 100A, a vertical drive circuit, a column signal processing circuit, a horizontal drive circuit, an output circuit, and the like.

In the multilayer wiring layer 22, for example, a gate wiring line 221 of a transistor included in the readout circuit and wiring layers 222, 223, 224, and 225 each including one or more wiring lines are stacked in this order from the semiconductor substrate 21 side with an interlayer insulating layer 226 interposed therebetween. A plurality of pad electrodes 227 is embedded in a front surface (a front surface 22S1 of the multilayer wiring layer 22), which is on an opposite side to the semiconductor substrate 21 side, of the interlayer insulating layer 226. The plurality of pad electrodes 227 is electrically coupled to some of the wiring lines in the wiring layer 225 via a via V3.

As with the interlayer insulating layer 182, the interlayer insulating layer 117 includes, for example, a single-layer film including one of silicon oxide ($SiO_x$), TEOS, silicon nitride ($SiN_x$), silicon oxynitride ($SiO_xN_y$), or the like, or a stacked film including two or more of those.

As with the wiring layer 181, the gate wiring line 221 and the wiring layers 222, 223, 224, and 225 includes, for example, aluminum (Al), copper (Cu), tungsten (W), or the like.

The pad electrode 227 is exposed on a surface to be bonded to the sensor board 10 (the front surface 22S1 of the multilayer wiring layer 22) and is used, for example, to be coupled to the sensor board 10. As with the pad electrode 183, the pad electrode 227 includes, for example, copper (Cu).

In the light detection device 1, for example, Cu—Cu bonding is performed between the pad electrode 183 and the pad electrode 227. As a result, the cathode of the light receiving element 12 is electrically coupled to the quenching resistor 120 provided on the logic board 20 side, and the anode of the light receiving element 12 is electrically coupled to the bias voltage applicator 110.

On the light incident surface (the second surface 11S2) side of the semiconductor substrate 11, for example, a microlens 33 is provided for each unit pixel P via a passivation film 31 and a color filter 32.

The microlens 33 condenses the light entered from up above to the light receiving element 12, and includes, for example, silicon oxide ($SiO_x$) or the like.

1-2. Method of Manufacturing Light Detection Device

It is possible to manufacture the sensor board 10, for example, as follows. First, ion implantation is performed to form the p-well (p) 111, the n-type semiconductor region (n) 112, and the p-type semiconductor region ($p^+$) 14X in the semiconductor substrate 11 by controlling the p-type or n-type impurity concentration. Thereafter, on the first surface 11S1 of the semiconductor substrate 11, for example, an oxide film including silicon oxide ($SiO_x$) or the like or a nitride film including ($SiN_x$) or the like is patterned as a hard mask, and following which, for example, a through hole penetrating the semiconductor substrate 11 is formed by etching. Thereafter, the insulation films 17B and 17C and the light-shielding film 17A are sequentially formed in the through hole by, for example, a CVD (Chemical Vapor Deposition) method, a PVD (Physical Vapor Deposition) method, an ALD (Atomic Layer Deposition) method, a vapor deposition method, or the like.

Thereafter, the semiconductor layer 15 including, for example, silicon (Si) is formed on the first surface 11S1 of the semiconductor substrate 11 by an epitaxial crystal growth method such as a MOCVD (Metal Organic Chemical Vapor Deposition) method, for example. Thereafter, the front surface of the semiconductor layer 15 is planarized by CMP (Chemical Mechanical Polishing), for example, following which the n-type semiconductor region ($n^+$) 14Y and the contact electrode 16 (the n-type semiconductor region ($n^{++}$)) are formed in the semiconductor layer 15 by ion implantation. This makes it possible to form the n-type semiconductor region ($n^+$) 14Y with a film thickness of, for example, less than or equal to 1 μm.

Thereafter, the first surface 15S1 of the semiconductor layer 15 is polished by CMP, for example, following which the multilayer wiring layer 18 is formed on the first surface 15S1 of the semiconductor layer 15. Thereafter, the logic board 20 which have been separately prepared is bonded. At this time, the plurality of pad electrodes 183 exposed on the bonding surface (the front surface 18S1) of the multilayer wiring layer 18 and the plurality of pad sections 217 exposed on the bonding surface (the front surface 22S) of the multilayer wiring layer 22 on the logic board 20 side are subjected to Cu—Cu bonding.

Thereafter, the second surface 11S2 of the semiconductor substrate 11 is polished by CMP, for example, following which the light-shielding section 17X, the passivation film 31, the color filter 32, and the microlens 33 are sequentially formed. Thus, the light detection device 1 illustrated in FIG. 1 is completed.

1-3. Workings and Effects

In the light detection device 1 according to the present embodiment, the semiconductor layer 15 is provided on the first surface 1S1 of the semiconductor substrate 11, and the n-type semiconductor region ($n^+$) 14Y included in the multiplier 14 is provided in the semiconductor layer 15. This ensures a distance between the anode electrically coupled to the light receiver 13, and the n-type semiconductor region ($n^+$) 14Y included in the multiplier 14 and the cathode. This will be described below.

In the photosensor having a general SPAD structure as described above, it is demanded that the anode and the n-type semiconductor region of the avalanche photodiode (APD) are laterally spaced apart from each other in order to suppress edge breakdown. It is thus unsuitable for miniaturization.

As a method of solving such an issue, an embedding structure in which the anode is embedded in the silicon substrate is given. However, such a structure makes a manufacturing process complicated, as contact ion implantation is performed after an opening for the anode is formed in the silicon substrate.

In contrast, in the present embodiment, the semiconductor layer 15 is provided on the first surface 1S1 of the semiconductor substrate 11 by an epitaxial crystal growth method, and the n-type semiconductor region ($n^+$) 14Y included in the multiplier 14 is provided in the semiconductor layer 15 by ion implantation. This makes it possible to suppress impurity diffusion and to increase charges rapidly as compared with a case where the n-type semiconductor region ($n^+$) 14Y is formed in the semiconductor substrate 11 as with the photosensor having the general SPAD structure.

As described above, the light detection device 1 according to the present embodiment is able to ensure the distance between the anode electrically coupled to the light receiver 13, and the n-type semiconductor region (n) 14Y included in the multiplier 14 and the cathode, and to suppress unintended edge breakdown.

Further, in the light detection device 1 according to the present embodiment, the n-type semiconductor region ($n^+$) 14Y included in the multiplier 14 is provided in the semiconductor layer 15, which makes it possible to increase the light reception region (the light receiver 13) for an amount of the n-type semiconductor region ($n^+$) 14Y. Accordingly, it is possible to improve sensitivity.

Next, Modification examples 1 to 11 according to the present disclosure, an application example, and a practical application example will be described. Hereinafter, similar components to those of the embodiment described above are denoted by the same reference numerals, and description thereof is omitted as appropriate.

2. Modification Examples

2-1. Modification Example 1

FIG. 4 schematically illustrates an example of a cross-sectional configuration of a light detection device (a light detection device 1A) according to Modification example 1 of the present disclosure. The light detection device 1A is to be applied to, for example, as with the above-described embodiment, the distance image sensor (the distance image apparatus 1000) that performs distance measurement by a ToF method, the image sensor, or the like. The light detection device 1A according to the present modification example is different from the above-described embodiment in that both the p-type semiconductor region ($p^+$) 14X and the n-type semiconductor region ($n^+$) 14Y included in the multiplier 14 are provided in the semiconductor layer 15.

As described above, in the light detection device 1A according to the present modification example, both the p-type semiconductor region ($p^+$) 14X and the n-type semiconductor region ($n^+$) 14Y included in the multiplier 14 are formed in the semiconductor layer 15. This makes it possible to further increase the light reception region (the light receiver 13) for an amount of the p-type semiconductor region ($p^+$) 14X, in addition to the effects of the above-described embodiment. Accordingly, it is possible to further improve sensitivity.

2-2. Modification Example 2

FIG. 5 schematically illustrates an example of a cross-sectional configuration of a light detection device (a light detection device 1B) according to Modification example 2 of the present disclosure. The light detection device 1B is to be applied to, for example, as with the above-described embodiment, the distance image sensor (the distance image apparatus 1000) that performs distance measurement by a ToF method, the image sensor, or the like. The light detection device 1B according to the present modification example is different from the above-described embodiment in that the semiconductor layer 15 is provided in part on the first surface 11S1 of the semiconductor substrate 11 for each unit pixel P.

FIGS. 6A to 6C each schematically illustrate an example of a planar shape of the semiconductor layer 15. The semiconductor layer 15 may have, for example, a rectangular shape as with the unit pixel P as illustrated in FIG. 6A, or may have a polygonal shape other than the rectangular shape as illustrated in FIG. 6B. Alternatively, the semiconductor layer 15 may have a circular shape as illustrated in FIG. 6C. In particular, in a case where a size of the pixel is small, it is preferable to have the circular shape illustrated in FIG. 6C from a viewpoint of edge-field relaxation in a lateral direction (for example, an XY plane direction).

It is possible to manufacture such a semiconductor layer 15 as follows. For example, as with the above-described embodiment, the p-well (p) 111, the n-type semiconductor region (n) 112, and the p-type semiconductor region ($p^+$) 14X are formed on the semiconductor substrate 11. Thereafter, an insulating layer 19 having an opening at a predetermined position on the first surface 11S1 of the semiconductor substrate 11 is patterned. The insulating layer 19 may be formed by using, for example, silicon oxide ($SiO_x$) or silicon nitride ($SiN_x$). Thereafter, the semiconductor layer 15 is formed by an epitaxial crystal growth method in the opening.

Further, in a case where the semiconductor layer 15 is provided in part for each unit pixel P as in the present modification example, a convex structure may be formed by processing the semiconductor substrate 11, and the convex structure portion may be used as the semiconductor laver 15.

As described above, in the light detection device 1B according to the present modification example, the semiconductor layer 15 is embedded and formed in the insulating layer 19 for each unit pixel P, and the n-type semiconductor region ($n^+$) 14Y included in the multiplier 14 is provided in the semiconductor layer 15. This makes it possible to secure more reliably the distance between the anode and the n-type semiconductor region ($n^+$) 14Y included in the multiplier 14 as compared with the above-described embodiment. Accordingly, in addition to the effects of the above-described embodiment, it is possible to further suppress unintended edge breakdown.

2-3. Modification Example 3

FIG. 7 schematically illustrates an example of a cross-sectional configuration of a light detection device (a light detection device 1C) according to Modification example 3 of the present disclosure. The light detection device 1C is to be applied to, for example, as with the above-described embodiment, the distance image sensor (the distance image apparatus 1000) that performs distance measurement by a ToF method, the image sensor, or the like. The light detection device 1C according to the present modification example is a combination of Modification example 1 and Modification example 2 described above. The semiconductor layer 15 is provided in part on the first surface 11S1 of the semiconductor substrate 11 for each unit pixel P, and both the p-type semiconductor region ($p^+$) 14X and the n-type semiconductor region ($n^+$) 14Y included in the multiplier 14 are provided in the semiconductor layer 15.

As described above, the semiconductor layer 15 may be provided in part for each unit pixel P. and both the p-type semiconductor region ($p^+$) 14X and the n-type semiconductor region ($n^+$) 14Y included in the multiplier 14 may be provided in the semiconductor layer 15. This makes it possible to more reliably secure the distance between the anode and the n-type semiconductor region ($n^+$) 14Y included in the multiplier 14, and to further increase the light reception region (the light receiver 13) for an amount of the p-type semiconductor region ($p^+$) 14X. Accordingly, it is possible to further suppress unintended edge breakdown and to further improve sensitivity.

2-4. Modification Example 4

FIG. 8 schematically illustrates an example of a cross-sectional configuration of a light detection device (a light detection device 1D) according to Modification example 4 of the present disclosure. The light detection device 1D is to be applied to, for example, as with the above-described embodiment, the distance image sensor (the distance image apparatus 1000) that performs distance measurement by a ToF method, the image sensor, or the like. The light detection device 1D according to the present modification example is different from the above-described embodiment in that the pixel separator 17 further extends into the semiconductor layer 15, and the pixel separator 17 penetrates the semiconductor layer 15.

Further, in the present modification example, the p-type semiconductor region ($p^+$) 113 extends into the semiconductor layer 15 together with the pixel separator 17, and is expanded toward the inside of the unit pixel P near the first surface 15S1 of the semiconductor layer 15 (the expansion section 113X).

As described above, in the light detection device 1D according to the present modification example, the pixel separator 17 extends from the semiconductor substrate 11 into the semiconductor layer 15, and the semiconductor layer 15 is separated for each unit pixel P by the pixel separator 17. This makes it possible to suppress crosstalk caused by light emission at the time of avalanche multiplication in the multiplier 14. Accordingly, it is possible to improve a device characteristic, in addition to the effects of the above-described embodiment.

2-5. Modification Example 5

FIG. 9 schematically illustrates an example of a cross-sectional configuration of a light detection device (a light detection device IE) according to Modification example 5 of the present disclosure. The light detection device IE is to be applied to, for example, as with the above-described embodiment, the distance image sensor (the distance image apparatus 1000) that performs range measurement by a ToF method, the image sensor, or the like. The light detection device IE according to the present modification example is different from the above-described embodiment in that, in a configuration obtained by combining Modification example 1 and Modification example 2 described above, a side surface of the semiconductor layer 15 provided in part for the unit pixel P has an inclined surface.

As described above, an angle of the side surface of the semiconductor layer 15 provided in part for each unit pixel P is not particularly limited, and may be perpendicular to the first surface 11S1 of the semiconductor substrate 11, or may be inclined with respect to the first surface 11S1 of the semiconductor substrate 11.

2-6. Modification Example 6

FIG. 10 schematically illustrates an example of a cross-sectional configuration of a light detection device (a light detection device 1F) according to Modification example 6 of the present disclosure. The light detection device 1F is to be applied to, for example, as with the above-described embodiment, the distance image sensor (the distance image apparatus 1000) that performs distance measurement by a ToF method, the image sensor, or the like. The light detection device 1F according to the present modification example is a further modification example of Modification example 2 described above, and is different from the above-described embodiment in that an end surface of the n-type semiconductor region ($n^+$) 14Y, to be formed in the semiconductor layer 15 provided in part for each unit pixel P, is formed on an inner side relative to the side surface of the semiconductor layer 15.

As described above, in the light detection device 1F according to the present modification example, the end surface of the n-type semiconductor region ($n^+$) 14Y is formed on the inner side relative to the side surface of the semiconductor layer 15 provided for each unit pixel P. and an n-type semiconductor region ($n^+$) 14Y-unformed region is provided at a periphery of the semiconductor layer 15. Accordingly, it is possible to reduce avalanche multiplication of dark current generated at an interface of the side surface of the semiconductor layer 15.

2-7. Modification Example 7

FIG. 11 schematically illustrates an example of a cross-sectional configuration of a light detection device (a light detection device 1G) according to Modification example 7 of the present disclosure. The light detection device 1G is to be applied to, for example, as with the above-described embodiment, the distance image sensor (the distance image apparatus 1000) that performs distance measurement by a ToF method, the image sensor, or the like. The light detection device 1G according to the present modification example is a combination of Modification example 1 and Modification example 6 described above. The respective end surfaces of the p-type semiconductor region ($p^+$) 14X and the n-type semiconductor region ($n^+$) 14Y included in the multiplier 14 are formed on the inner side relative to the side surface of the semiconductor layer 15 provided in part for each unit pixel P.

Accordingly, it is possible to further increase the light reception region (the light receiver 13), and to reduce avalanche multiplication of dark current generated at the interface of the side surface of the semiconductor layer 15.

2-8. Modification Example 8

FIG. 12 schematically illustrates an example of a cross-sectional configuration of a light detection device (a light detection device 1H) according to Modification example 8 of the present disclosure. FIG. 13 schematically illustrates a planar layout of the p-type semiconductor region ($p^+$) 14X and the n-type semiconductor region ($n^+$) 14Y in the unit pixel P of the light detection device 1H illustrated in FIG. 12. The light detection device 1H is to be applied to, for example, as with the above-described embodiment, the distance image sensor (the distance image apparatus 1000) that performs distance measurement by a ToF method, the image sensor, or the like. The light detection device 1H according to the present modification example is different from Modification example 2 described above in that a plurality of semiconductor layers 15 in which the n-type semiconductor region ($n^+$) 14Y included in the multiplier 14 is formed is provided for each unit pixel P.

As described above, the plurality of semiconductor layers 15 in which the n-type semiconductor region ($n^+$) 14Y included in the multiplier 14 is formed may be provided for each unit pixel P. Accordingly, in addition to the effects of the above-described embodiment, it is possible to improve light absorption efficiency.

2-9. Modification Example 9

FIG. 14 schematically illustrates an example of a cross-sectional configuration of a light detection device (a light detection device 1I) according to Modification example 9 of the present disclosure. FIG. 15 schematically illustrates a planar layout of a reflection layer 41 in the unit pixel P of the light detection device 1I. The light detection device 1I is to be applied to, for example, as with the above-described embodiment, the distance image sensor (the distance image apparatus 1000) that performs distance measurement by a ToF method, the image sensor, or the like. The light detection device 1I according to the present modification example has a configuration in which, addition to the configuration of Modification example 2 described above, the reflection layer 41 is provided in such a manner as to surround the semiconductor layer 15 in the insulating layer 19 provided around the semiconductor layer 15, for example.

The reflection layer 41 may be formed by using, for example, a light-reflective wiring line material such as aluminum (Al).

As described above, in the present modification example of light detection device 1I, for example, the reflection layer 41 surrounding the semiconductor layer 15 is provided in the insulating layer 19 provided around the semiconductor layer 15, for example. Thus, light transmitted without being absorbed in the light receiver 13 is reflected by the reflection layer 41 and re-enters the light receiver 13. Accordingly, in addition to the effects of Modification example 2 described above, it is possible to further improve sensitivity.

2-10. Modification Example 10

FIG. 16 schematically illustrates an example of a cross-sectional configuration of a light detection device (a light detection device 1J) according to Modification example 10 of the present disclosure. FIG. 17 schematically illustrates an example of a wiring layout with respect to the reflection layer 41 illustrated in FIG. 16. The light detection device 13 is to be applied to, for example, as with the above-described embodiment, the distance image sensor (the distance image apparatus 1000) that performs distance measurement by a ToF method, the image sensor, or the like. A portion of the reflection layer 41 may be split. One end thereof and the cathode (the contact electrode 16) may be electrically coupled to each other, for example, via the via V1, and the other end thereof may be electrically coupled to the readout circuit. It is thus possible to use the reflection layer 41 as a resistor of the readout circuit. Accordingly, it is possible to improve an area efficiency of the readout circuit.

2-11. Modification Example 11

FIG. 18 schematically illustrates an example of a cross-sectional configuration of a light detection device (a light detection device 1K) according to Modification example 11 of the present disclosure. The light detection device 1K is to be applied to, for example, as with the above-described embodiment, the distance image sensor (the distance image apparatus 1000) that performs distance measurement by a ToF method, the image sensor, or the like. In Modification example 9 described above, the reflection layer 41 is provided in the insulating layer 19 provided around the semiconductor layer 15, and the light transmitted without being absorbed in the light receiver 13 is caused to re-enter the light receiver 13. In contrast, in the present modification example, any of the wiring lines in the wiring layer 181 (for example, a wiring line 181A) provided in the interlayer insulating layer 182 is expanded in the XY plane direction, and this is used as the reflection layer. Thus, as with Modification example 0 described above, it is possible to cause the light transmitted without being absorbed in the light receiver 13 to re-enter the light receiver 13.

3. Application Example

Figure 19:
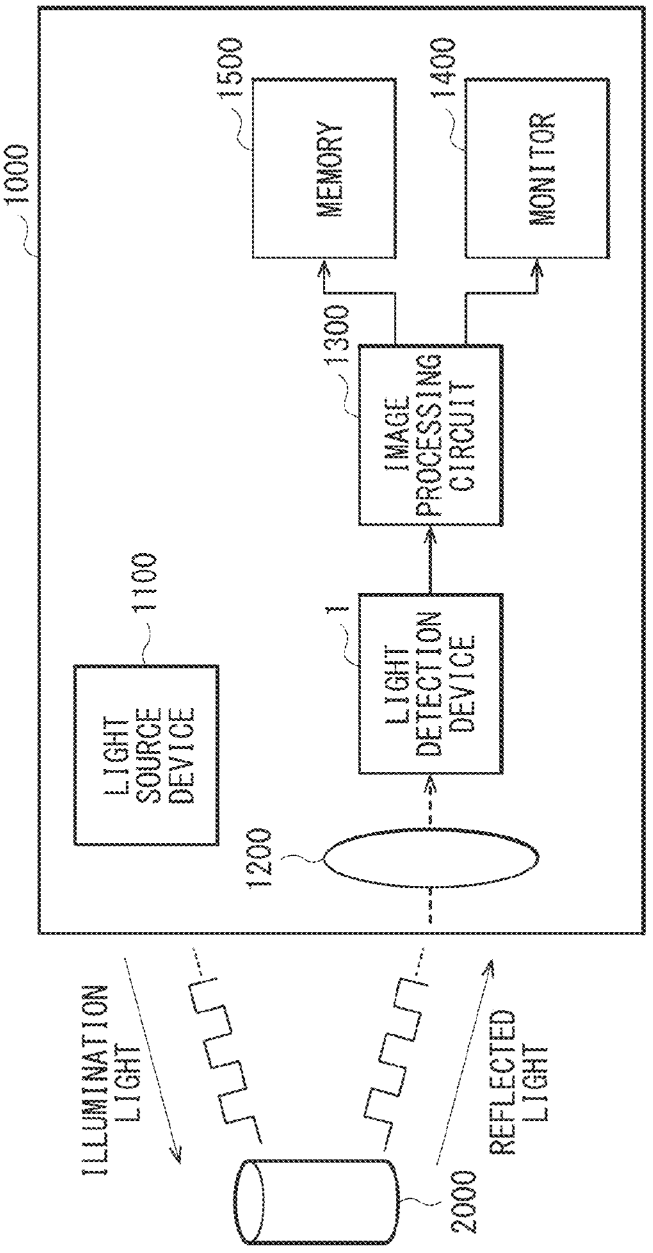

FIG. 19 illustrates an example of a schematic configuration of the distance image apparatus 1000 serving as an electronic apparatus including the light detection device (for example, the light detection device 1) according to the embodiment and Modification examples 1 to 11 described above. The distance image apparatus 1000 corresponds to a specific example of a "distance measurement apparatus" according to the present disclosure.

The distance image apparatus 1000 includes, for example, a light source device 1100, an optical system 1200, a light detection device 1, an image processing circuit 1300, a monitor 1400, and a memory 1500.

The distance image apparatus 1000 receives light (modulated light or pulsed light) projected from the light source device 1100 toward an irradiation target object 2000 and reflected by a front surface of the irradiation target object 2000, thereby obtaining a distance image corresponding to a distance to the irradiation target object 2000.

The optical system 1200 includes one or a plurality of lenses, and guides image light (incident light) from the irradiation target object 2000 to the light detection device 1 to form an image on a light receiving surface (a sensor unit) of the light detection device 1.

The image processing circuit 1300 performs image processing for constructing the distance image on the basis of a distance signal supplied from the light detection device 1, and the distance image (image data) obtained by the image processing is supplied to the monitor 1400 and displayed, or is supplied to the memory 1500 and stored (recorded).

In the distance image apparatus 1000 configured as described above, application of the above-described light detection device (for example, the light detection device 1) makes it possible to calculate the distance to the irradiation target object 2000 only on the basis of the light reception signal from the highly stable unit pixel P, and to generate a highly accurate distance image. That is, the distance image apparatus 1000 is able to acquire a more accurate distance image.

4. Practical Application Example

Example of Practical Application to Mobile Body

The technology according to the present disclosure is applicable to a variety of products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

Figure 20:
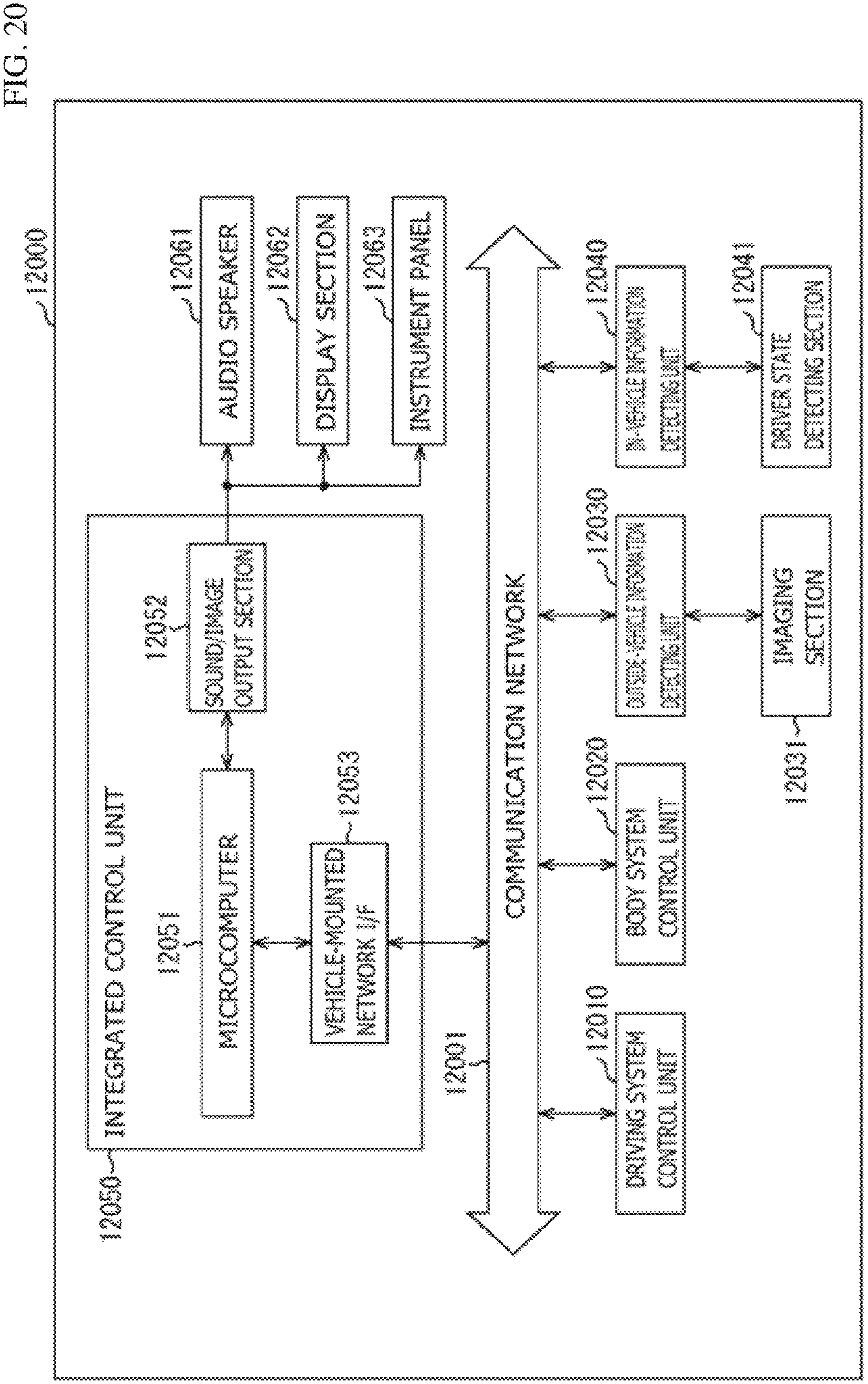
FIG. 20 is a block diagram depicting an example of schematic configuration of a vehicle control system.

FIG. 20 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 20, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 20, an audio speaker 12061, a display section 12062, and an instrument panel 12063 are illustrated as the output device. The display section 12062 may, for example, include at least one of an on-board display and a head-up display.

FIG. 21 is a diagram depicting an example of the installation position of the imaging section 12031.

In FIG. 21, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 21 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Although the description has been given with reference to the embodiment, Modification examples 1 to 11, the application examples, and the practical application examples, the contents of the present disclosure are not limited to the above-described embodiments and the like. The present disclosure may be modified in a variety of ways. For example, the light detection device of the present disclosure does not have to include all of the components described in the above embodiment and the like, and may include other layers. For example, in a case where the light detection device 1 is to detect light other than visible light (for example, near-infrared light (IR)), the color filter 32 may be omitted.

Further, a polarity of the semiconductor region included in the light detection device according to the present disclosure may be inverted. In addition, in the light detection device according to the present disclosure, holes may serve as the signal charges.

Still further, as long as the light detection device according to the present disclosure is in a state in which the avalanche multiplication occurs by applying a reverse-bias between the anode and the cathode, the respective potentials are not limited.

Further, in the above embodiment and the like, an example in which the semiconductor substrate 11 and the semiconductor layer 15 each include silicon; however, the semiconductor substrate 11 and the semiconductor layer 15 may each include, for example, germanium (Ge), or a compound semiconductor (for example, silicon germanium (SiGe)) of silicon (Si) and germanium (Ge).

It should be appreciated that the effects described herein are mere examples. The disclosure may include any effects other than those described herein, or may further include other effects in addition to those described herein.

It is to be noted that the present disclosure may have the following configurations. According to the present technology having the following configurations, a semiconductor layer is provided on a side of a first surface of a semiconductor substrate, the semiconductor substrate having the first surface and a second surface that are opposed to each other, and at least a second conduction-type region, out of a first conduction-type region and the second conduction-type region that are included in a multiplier, is provided in the semiconductor layer. Thus, a distance between a first electrode electrically coupled to a light receiver and the second conduction-type region included in the multiplier is ensured, which makes it possible to suppress unintended edge breakdown.

(1)

A light detection device including:

a semiconductor substrate that includes a first surface and a second surface opposed to each other, and includes a pixel array in which a plurality of pixels is disposed in an array;

a semiconductor layer that is provided on a side of the first surface of the semiconductor substrate;

a light receiver that is provided inside the semiconductor substrate for each of the pixels, and generates carriers corresponding to a received light amount by photoelectric conversion;

a multiplier that includes a first conduction-type region and a second conduction-type region sequentially stacked on the side of the first surface, at least the second conduction-type region being provided in the semiconductor layer, and that performs avalanche multiplication on the carriers generated by the light receiver;

a first electrode that is provided on the side of the first surface, and is electrically coupled to the light receiver; and a second electrode that is provided on the side of the first surface, and is electrically coupled to the multiplier.

(2)

The light detection device according to (1), in which the multiplier includes the first conduction-type region and the second conduction-type region both of which are provided in the semiconductor layer.

(3)

The light detection device according to (1) or (2), further including an insulating layer on the side of the first surface of the semiconductor substrate, in which the semiconductor layer is embedded and formed in the insulating layer for each of the pixels.

(4)

The light detection device according to (3), in which the multiplier formed in the semiconductor layer has an end surface on an inner side relative to a side surface of the semiconductor layer.

(5)

The light detection device according to any one of (1) to (4), in which a side surface of the semiconductor layer is inclined with respect to the first surface.

(6)

The light detection device according to any one of (1) to (5), in which the semiconductor substrate further includes a pixel separator that separates the plurality of pixels from each other and penetrates the semiconductor substrate between the first surface and the second surface.

(7)

The light detection device according to (6), in which the pixel separator further penetrates the semiconductor layer.

(8)

The light detection device according to (6) or (7), in which the pixel separator includes a conductive film and an insulation film, the conductive film having a light-shielding property, the insulation film being provided between the conductive film and the semiconductor substrate.

(9)

The light detection device according to any one of (6) to (8), further including a first conduction-type impurity region around the pixel separator, in which the light receiver and the first electrode are electrically coupled to each other via the first conduction-type impurity region.

(10)

The light detection device according to any one of (1) to (9), further including a second conduction-type impurity region in the semiconductor layer, in which the multiplier and the second electrode are electrically coupled to each other via the second conduction-type impurity region.

(11)

The light detection device according to any one of (3) to (10), further including a reflection layer that is provided in the insulating layer and surrounds the semiconductor layer.

(12)

The light detection device according to (11), in which the reflection layer is split, one end is coupled to the second electrode, and another end is coupled to a readout circuit that reads out the carriers multiplied by the multiplier.

(13)

The light detection device according to any one of (1) to (12), in which the semiconductor substrate and the semiconductor layer each include silicon.

(14)

A distance measurement apparatus including:

an optical system;

a light detection device; and a signal processing circuit that calculates a distance to a measurement object on a basis of an output signal from the light detection device, in which the light detection device includes a semiconductor substrate that includes a first surface and a second surface opposed to each other, and includes a pixel array in which a plurality of pixels is disposed in an array;

a semiconductor layer that is provided on a side of the first surface of the semiconductor substrate;

a light receiver that is provided inside the semiconductor substrate for each of the pixels, and generates carriers corresponding to a received light amount by photoelectric conversion;

a multiplier that includes a first conduction-type region and a second conduction-type region sequentially stacked on the side of the first surface, at least the second conduction-type region being provided in the semiconductor layer, and that performs avalanche multiplication on the carriers generated by the light receiver;

a first electrode that is provided on the side of the first surface, and is electrically coupled to the light receiver; and a second electrode that is provided on the side of the first surface, and is electrically coupled to the multiplier.

This application claims the benefit of Japanese Priority Patent Application JP2021-011535 filed with the Japan Patent Office on Jan. 27, 2021, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light detection device comprising:

a semiconductor substrate that includes a first surface and a second surface opposed to each other, and includes a pixel array in which a plurality of pixels is disposed in an array;

a semiconductor layer that is provided on a side of the first surface of the semiconductor substrate;

a light receiver that is provided inside the semiconductor substrate for each of the pixels, and generates carriers corresponding to a received light amount by photoelectric conversion;

a multiplier that includes a first conduction-type region and a second conduction-type region sequentially stacked on the side of the first surface, at least the second conduction-type region being provided in the semiconductor layer, and that performs avalanche multiplication on the carriers generated by the light receiver;

a first electrode that is provided on the side of the first surface, and is electrically coupled to the light receiver;

a second electrode that is provided on the side of the first surface, and is electrically coupled to the multiplier;

an insulating layer disposed on the side of the first surface of the semiconductor substrate, the semiconductor layer being embedded in the insulating layer for each of the pixels; and a reflection layer that is provided in the insulating layer so as to surround the semiconductor layer for each of the pixels, wherein the reflection layer is split, a first end of the reflection layer is electrically coupled to the second electrode, and a second end of the reflection layer is electrically coupled to a readout circuit that reads out carriers multiplied by the multiplier.

2. The light detection device according to claim 1, wherein the multiplier includes the first conduction-type region and the second conduction-type region both of which are provided in the semiconductor layer.

3. The light detection device according to claim 1, wherein the multiplier formed in the semiconductor layer has an end surface on an inner side relative to a side surface of the semiconductor layer.

4. The light detection device according to claim 1, wherein a side surface of the semiconductor layer is inclined with respect to the first surface.

5. The light detection device according to claim 1, wherein the semiconductor substrate further includes a pixel separator that separates the plurality of pixels from each other and penetrates the semiconductor substrate between the first surface and the second surface.

6. The light detection device according to claim 5, wherein the pixel separator further penetrates the semiconductor layer.

7. The light detection device according to claim 5, wherein the pixel separator includes a conductive film and an insulation film, the conductive film having a light-shielding property, the insulation film being provided between the conductive film and the semiconductor substrate.

8. The light detection device according to claim 5, further comprising a first conduction-type impurity region around the pixel separator, wherein the light receiver and the first electrode are electrically coupled to each other via the first conduction-type impurity region.

9. The light detection device according to claim 1, further comprising a second conduction-type impurity region in the semiconductor layer, wherein the multiplier and the second electrode are electrically coupled to each other via the second conduction-type impurity region.

10. The light detection device according to claim 1, wherein the semiconductor substrate and the semiconductor layer each include silicon.

11. A distance measurement apparatus comprising:

an optical system;

a light detection device; and a signal processing circuit that calculates a distance to a measurement object on a basis of an output signal from the light detection device, wherein the light detection device includes a semiconductor substrate that includes a first surface and a second surface opposed to each other, and includes a pixel array in which a plurality of pixels is disposed in an array;

a semiconductor layer that is provided on a side of the first surface of the semiconductor substrate;

a light receiver that is provided inside the semiconductor substrate for each of the pixels, and generates carriers corresponding to a received light amount by photoelectric conversion;

a multiplier that includes a first conduction-type region and a second conduction-type region sequentially stacked on the side of the first surface, at least the second conduction-type region being provided in the semiconductor layer, and that performs avalanche multiplication on the carriers generated by the light receiver;

a first electrode that is provided on the side of the first surface, and is electrically coupled to the light receiver;

a second electrode that is provided on the side of the first surface, and is electrically coupled to the multiplier;

an insulating layer disposed on the side of the first surface of the semiconductor substrate, the semiconductor layer being embedded in the insulating layer for each of the pixels; and a reflection layer that is provided in the insulating layer so as to surround the semiconductor layer for each of the pixels, wherein the reflection layer is split, a first end of the reflection layer is electrically coupled to the second electrode, and a second end of the reflection layer is electrically coupled to a readout circuit that reads out carriers multiplied by the multiplier.

12. The distance measurement apparatus according to claim 11, wherein the multiplier includes the first conduction-type region and the second conduction-type region both of which are provided in the semiconductor layer.

13. The distance measurement apparatus according to claim 11, wherein the multiplier formed in the semiconductor layer has an end surface on an inner side relative to a side surface of the semiconductor layer.

14. The distance measurement apparatus according to claim 11, wherein a side surface of the semiconductor layer is inclined with respect to the first surface.

15. The distance measurement apparatus according to claim 11, wherein the semiconductor substrate further includes a pixel separator that separates the plurality of pixels from each other and penetrates the semiconductor substrate between the first surface and the second surface.

16. The distance measurement apparatus according to claim 15, wherein the pixel separator further penetrates the semiconductor layer.

17. The distance measurement apparatus according to claim 15, wherein the pixel separator includes a conductive film and an insulation film, the conductive film having a light-shielding property, the insulation film being provided between the conductive film and the semiconductor substrate.

18. The distance measurement apparatus according to claim 15, further comprising a first conduction-type impurity region around the pixel separator, wherein the light receiver and the first electrode are electrically coupled to each other via the first conduction-type impurity region.

19. The distance measurement apparatus according to claim 11, further comprising a second conduction-type impurity region in the semiconductor layer, wherein the multiplier and the second electrode are electrically coupled to each other via the second conduction-type impurity region.

20. The distance measurement apparatus according to claim 11, wherein the semiconductor substrate and the semiconductor layer each include silicon.

* * * * *